US008225658B2

(12) United States Patent
Leung et al.

(10) Patent No.: US 8,225,658 B2
(45) Date of Patent: Jul. 24, 2012

(54) THREE-DIMENSIONAL MICROSTRUCTURES AND METHODS FOR MAKING SAME

(75) Inventors: Albert M. Leung, Burnaby (CA); Meenakshinathan Parameswaran, Coquitlam (CA); See-Ho Tsang, Richmond (CA)

(73) Assignee: Simon Fraser University, Burnaby (CA)

( * ) Notice: Subject to any disclaimer, the term of this patent is extended or adjusted under 35 U.S.C. 154(b) by 541 days.

(21) Appl. No.: 12/413,455

(22) Filed: Mar. 27, 2009

(65) Prior Publication Data

US 2009/0242882 A1   Oct. 1, 2009

Related U.S. Application Data

(63) Continuation-in-part of application No. PCT/CA2007/001723, filed on Sep. 27, 2007.

(60) Provisional application No. 60/827,406, filed on Sep. 28, 2006.

(51) Int. Cl.
  *G01P 15/00*  (2006.01)
  *F16M 13/00*  (2006.01)
(52) U.S. Cl. ........ 73/493; 73/514.09; 248/573; 248/629
(58) Field of Classification Search .......... 73/493, 73/514.16, 514.09; 248/573, 629; 438/52, 438/54, 55
See application file for complete search history.

(56) References Cited

U.S. PATENT DOCUMENTS

| | | | |
|---|---|---|---|
| 5,796,152 A | * | 8/1998 | Carr et al. .......... 257/415 |
| 6,130,464 A | * | 10/2000 | Carr .......... 257/417 |
| 6,666,088 B2 | | 12/2003 | Leung |
| 6,701,612 B2 | | 3/2004 | Khandros et al. |
| 6,858,911 B2 | | 2/2005 | Tamura et al. |
| 6,956,283 B1 | | 10/2005 | Peterson |

OTHER PUBLICATIONS

Tsang, S.H. et al., "Automated assembly of hingeless 90 degree out-of-plane microstructures", Journal of Micromechanics and Microengineering, vol. 17, 2007, pp. 1314-1325.
Leung, Albert M. et al., "Micromachined accelerometer with no proof mass", IEEE 1997, pp. 36.3.1 to 36.3.4.
Judy, Jack W. et al., "Magnetic Microactuation of Polysilicon Flexure Structures", Journal of Microelectromechanical Systems, vol. 4., No. 4, Dec. 1995, pp. 162-169.
Zou, Jun et al., "Plastic Deformation Magnetic Assembly (PDMA) of Out-of-Plane Microstructures: Technology and Application", Journal of Microelectromechanical Systems, vol. 10, No. 2, Jun. 2001, pp. 302-309.
Lai, King W.C. et al., "Non-Contact Batch Micro-Assembly by Centrifugal Force", IEEE MEMS 2002, Jan. 2002.

(Continued)

*Primary Examiner* — John Chapman, Jr.
(74) *Attorney, Agent, or Firm* — Oyen Wiggs Green & Mutala LLP

(57) ABSTRACT

Microstructures can be formed as patterned layers on a substrate and then erecting the microstructures out of the plane of the substrate. The microstructures may be formed over circuits in the substrate. In some embodiments the patterned layer provides resiliently-flexible members such as cantilevers or springs that can be buckled to permit an edge defined by the patterned layer to engage a surface of the substrate. In some embodiments deformation of the resiliently-flexible members results the edge being forced against the substrate. Such microstructures may be applied in a wide range of applications including supporting optical elements, sensors, antennas or the like out of the plane of a substrate. Examples of accelerometer structures are described.

53 Claims, 25 Drawing Sheets

OTHER PUBLICATIONS

Syms, Richard R.A., "Surface Tension Powered Self-Assembly of 3-D Micro-Optomechanical Structures", Journal of Microelectromechanical Systems, vol. 8, No. 4, Dec. 1999, pp. 448-455.

Dechev, Nikolai et al., "Microassembly of 3-D Microstructures Using a Compliant, Passive Microgripper", Journal of Microelectromechanical Systems, vol. 13, No. 2, Apr. 2004, pp. 176-189.

Seki, Tomonori et al., "Thermal Buckling Actuator for Micro Relays", IEEE 1997, pp. 1153-1156.

Garcia, Ernest J., "Micro-Flex Mirror and Instability Actuation Technique", IEEE 1998, pp. 470-475.

Tsang, S.H. et al., "Wirebonder Assembly of Hingeless 90 Degree Out-of-plane Microstructures", Solid-State Sensors, Actuators, and Microsystems Workshop, Jun. 4-8, 2006, pp. 344-347.

Koester, David et al., PolyMUMPS Design Handbook, MEMSCAP 2003.

Lorenz, H. et al., "SU-8: A low-cost negative resist for MEMS", J. Micromech. Microeng. vol. 7, pp. 121-124, 1997.

Sameoto, D. et al., "Polymer MEMS processing for multi-user applications", Sensors and Actuators A, vol. 134, pp. 457-464, 2007.

* cited by examiner

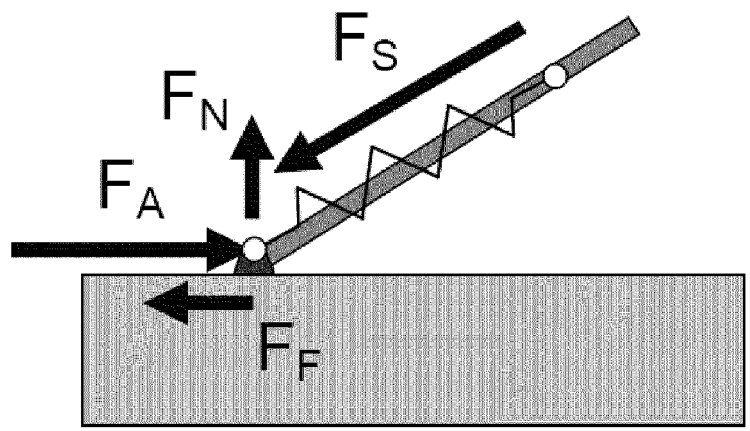
FIGURE 7D
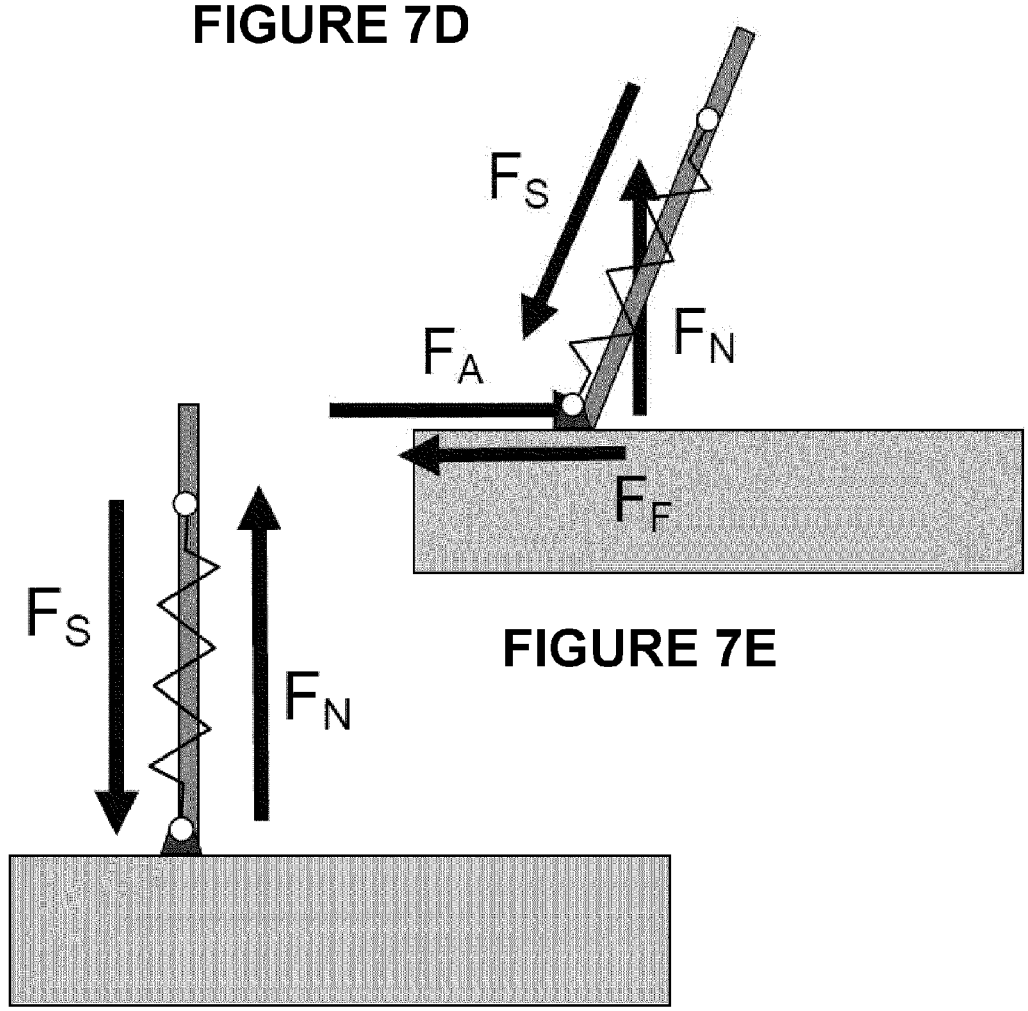
FIGURE 7E
FIGURE 7F

THREE-DIMENSIONAL MICROSTRUCTURES AND METHODS FOR MAKING SAME

CROSS-REFERENCE TO RELATED APPLICATION

This application is a continuation in part of PCT patent application No. PCT/CA2007/001723 filed on 27 Sep. 2007 and entitled THREE-DIMENSIONAL MICROSTRUCTURES AND METHODS FOR MAKING SAME which is hereby incorporated herein by reference in its entirety. For purposes of the United States, this application claims the benefit under 35 U.S.C. §119 of U.S. patent application No. 60/827,406 filed on 28 Sep. 2006 and entitled 3-DIMENSIONAL MICROSTRUCTURES AND METHODS FOR MAKING SAME, which is hereby incorporated herein by reference in its entirety.

TECHNICAL FIELD

The invention relates to micro-structures. The invention relates in particular to structures having components that extend out of the plane of a substrate. The invention may be applied to making structures of silicon that extend out of the plane of a silicon substrate. The structures may be applied to support things such as, without limitation, components of accelerometers, antennas, and optical components. The structures typically have dimensions of 1 cm or smaller.

SUMMARY

The inventions described herein have a number of different aspects that may be applied individually, together or in any suitable combinations. These aspects provide, without limitation:

- microstructures that can be fabricated in the plane of a substrate and then erected.
- methods for erecting out-of-plane microstructures which involve moving a portion of a microstructure along a substrate and then holding the portion of the microstructure in place by engagement between the portion of the microstructure and the substrate.
- microstructures having flexible members in which an electrical conductor lies on a neutral axis of a flexible member.
- methods for automated erection of out-of-plane structures which involve the use of a wire-bonding machine to push on actuating elements of micro structures.

One aspect of the invention provides apparatus comprising: a substrate and a member extending parallel to a surface of the substrate. The member is connected to the substrate by at least one resiliently flexible element. The resiliently flexible element has a first end anchored to the substrate and a second end attached to the member. The member is movable relative to the substrate in at least a first direction. The flexible element has a stiffness in respect of bending about a first bending axis that is transverse to the first direction that is less than a stiffness of the flexible element in respect of bending about a second bending axis that is at right angles to the substrate. The flexible element deforms to project away from the substrate in response to motion of the member in the first direction. A first edge of the member or the flexible element is engageable with the surface of the substrate upon moving the member in the first direction.

Another aspect of the invention provides an out-of-plane microstructure comprising: a substrate and a resiliently flexible cantilever structure having a first end anchored to the substrate and a second free end. The cantilever structure extends over a surface of the substrate. The microstructure has a stop member on the substrate. An edge of the cantilever structure is movable relative to the substrate in at least a first direction and is engageable with the stop member by moving the edge so that it passes over the stop member. The cantilever structure is buckled and extends away from the substrate when engaged with the stop member in an erected configuration.

Another aspect of the invention provides a microstructure comprising a member connected to a substrate by first and second springs and movable along the substrate in at least a first direction. The first spring is connected between a first point on the member and a first anchor point on the substrate. The second spring is connected between a second point on the member and a second anchor point on the substrate. The first and second springs are less stiff in respect of bending about a first bending axis that is transverse to the first direction than in respect of bending about a second bending axis that is at right angles to the substrate.

Another aspect of the invention provides a method for erecting an out-of plane microstructure, the method comprises applying a force acting in a direction essentially parallel to a surface of a substrate to a first edge of a member that is essentially parallel to a surface of a substrate and is connected to the substrate by a resiliently flexible element. The resiliently flexible element has one end anchored to the substrate and another end attached to the member. The method comprises moving the first edge along the substrate and thereby tilting the member to lift a second edge of the member that is opposed to the first edge of the member away from the substrate and retaining the member in an erected position by engaging the first edge with the substrate.

Another aspect of the invention provides a micromechanical structure comprising a member. The member comprises a first layer, a second layer, and an electrically conductive member extending between the first and second layers. The electrically-conductive member is disposed in a neutral plane of the member.

Some aspects of the invention may be applied independently from one another. For example, various three-axis accelerometer geometries are described herein. While sensor plates for supporting such three-axis accelerometers may be provided by microstructures having features as described herein, this is not mandatory. Accelerometers having the described geometries may be supported on surfaces provided in other ways.

Further aspects of the invention and features of a range of embodiments of the invention are set out below.

BRIEF DESCRIPTION OF THE DRAWINGS

The accompanying drawings illustrate non-limiting embodiments of the invention.

FIG. 5A shows a plan view of a microstructure prior to erection of the microstructure. FIG. 5B shows a microstructure according to another embodiment wherein a sheet is supported between two cantilevered portions. FIG. 5C shows a microstructure according to another embodiment wherein multiple sheet portions are connected between cantilever portions. FIGS. 5D, 5E and 5F respectively show microstructures like those shown in FIGS. 5A to 5C in their erected configurations. FIGS. 5G and 5H are plan and side views of a microstructure having a sheet that is longer than cantilever arms that support the sheet. The microstructure is shown unerected in FIG. 5G and erected in FIG. 5H. FIG. 5I is a plan view of a microstructure wherein a cantilever supports multiple sheets with at least one sheet on each side of the cantilever.

FIG. 6A shows a plan view of a microstructure in a non-erected configuration. FIG. 6B is a side view of the microstructure in an erected configuration. FIG. 6C is a front view of the microstructure in the erected configuration. FIG. 6D is a perspective view of the microstructure in the erected configuration. FIG. 6E is a plan view showing dimensions of an example prototype of the microstructure.

FIGS. 7A through 7F are force diagrams which illustrate the forces acting upon a member of a microstructure of the type illustrated in FIGS. 6A to 6C as it is moved from its non-erected configuration to its erected configuration.

FIG. 8 is a side view. FIG. 8A is a plan view.

FIG. 11 is a flowchart illustrating a method for erecting microstructures using a wire-bonding machine or the like.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

This invention has a number of aspects. While the aspects may be applied independently, they also have application in various combinations with one another.

One aspect of the invention provides microstructures that comprise at least one member that initially lies close to a surface of a substrate and can be caused to tilt out of the plane of the substrate by applying a force to the member in a direction that is at least generally parallel to a surface of the substrate. The member can then be maintained in an erected configuration by suitable engagement between the member and the substrate. The microstructures typically have dimensions of tens or hundreds of μm. In some embodiments the microstructures may project from a substrate by a distance of up to about 1 cm.

The member may be connected to the substrate by a flexible element that is anchored at one end to the substrate. In preferred embodiments the member and flexible element are integral with one another. In preferred embodiments the flexible element permits the member to be tilted through an angle such that a tangent to the member forms an angle of at least 30 degrees and in some embodiments in excess of 45 or 70 degrees to the substrate.

In some embodiments the member comprises a portion of a cantilever that can be buckled. Buckling the cantilever displaces a portion of the cantilever away from a substrate to which the cantilever is mounted. A free end of the cantilever can be held in place by a latch mechanism so as to retain the cantilever in the buckled configuration.

Figure 1:
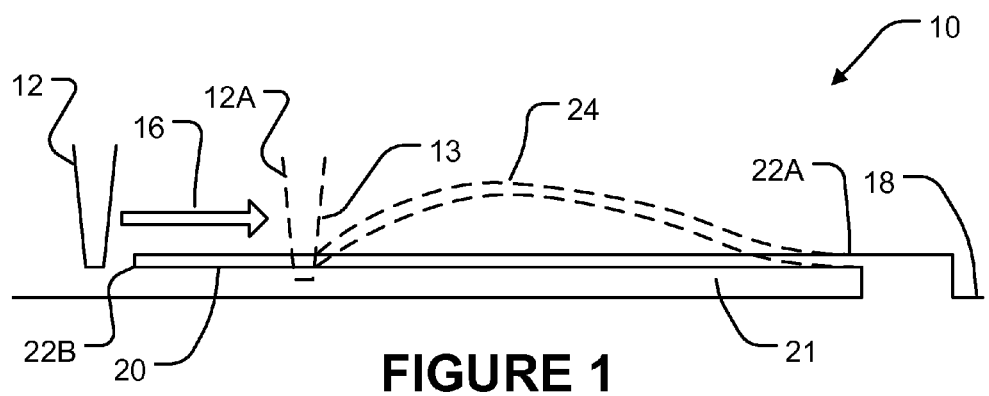
FIG. 1 is a schematic view of a microstructure comprising a cantilever that extends over a substrate. The cantilever can be buckled to provide an out-of-plane feature.

FIG. 1 illustrates schematically an example embodiment wherein a movable element of a microstructure 10 comprises a cantilever 20 that extends over a substrate 18. Cantilever 20 is anchored at an anchored end 22A and is separated from substrate 18 by a gap 21. Gap 21 may be fabricated by any suitable process such as removing a sacrificial layer, directional etching or another suitable fabrication process. In some embodiments gap 21 is provided by a method which includes depositing a removable layer of a material that decomposes upon the application of heat to the substrate. The material may comprise a heat-decomposition polymer, for example. A layer to form cantilever 20 is deposited on the removable layer. The device is then heated to a temperature at which the material of the removable layer decomposes without harming the material of cantilever 20. The temperature may be, for example, less than 450° C.

Microstructure 10 can be erected by applying force to the end of cantilever 20. In the illustrated embodiment, the force is applied by a tip 12 of a wire bonding machine, probe station, pick and place machine, micromanipulator or the like. Tip 12 is initially placed at a location proximate a free end 22B of cantilever 20 as indicated in solid outline. Advancing tip 12 toward cantilever 20 as indicated by arrow 16 to position 12A (shown in dashed outline) causes cantilever 20 to buckle and thrusts a portion 24 of cantilever 20 upwardly.

In some embodiments a linkage is moved by the buckling of cantilever 20 away from substrate 18 and the linkage moves some other element (not shown in FIG. 1A) to an erected configuration. In some embodiments, cantilever 20 itself constitutes the microstructure being erected.

In some embodiments, the tip 12 has a tapered side face 13, as illustrated in FIG. 1. Tapered side face is brought to bear on free end 22 of cantilever 20. The taper in side face 13 may prevent free end 22 of cantilever 20 from lifting as it is displaced by tip 12.

In some embodiments a linkage is moved by the motion of the central part 24A of member 20A away from substrate 18 and the linkage moves some other element to an erected configuration. In some embodiments, member 20A itself constitutes the microstructure being erected.

Figure 2A:
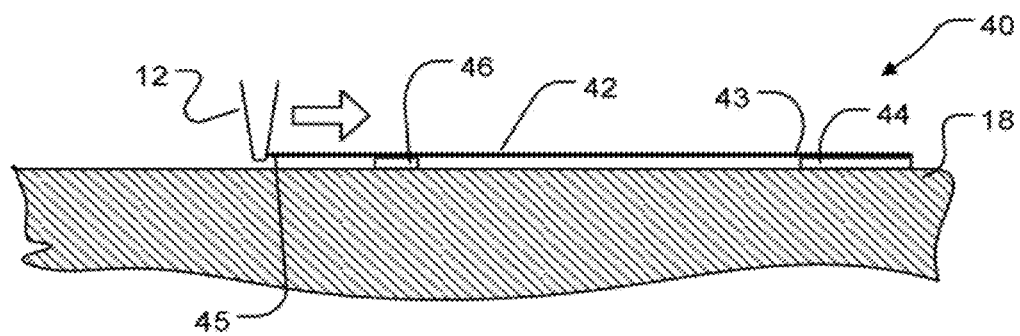
FIGS. 2A through 2C are schematic illustrations showing steps in the erection of a microstructure which includes a cantilever member having an anchored end and a free end.
Figure 2B:
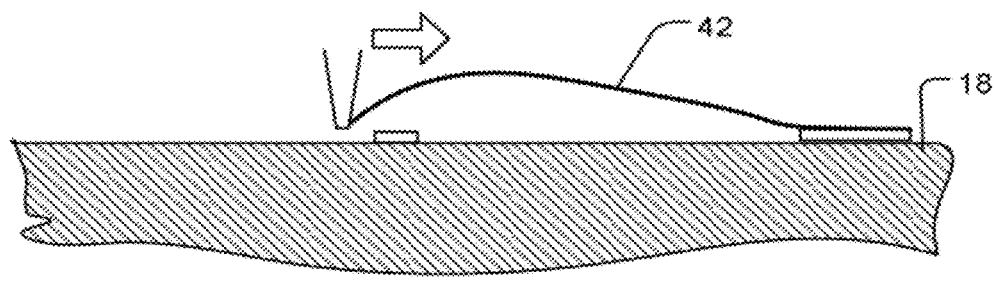
Figure 2C:
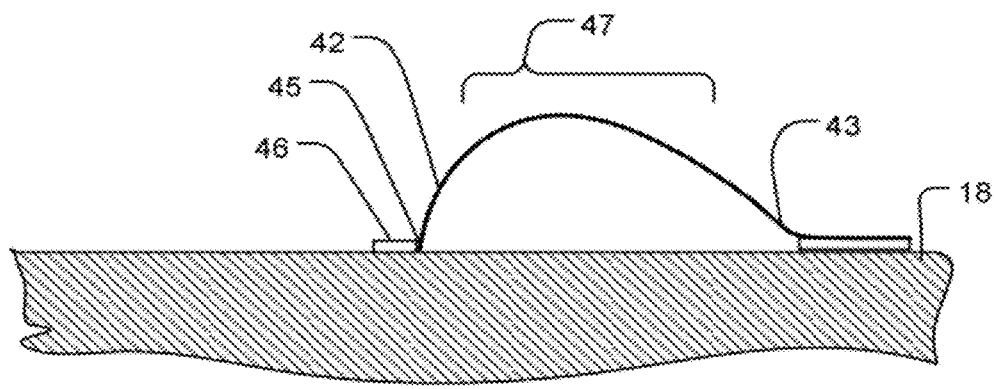

FIGS. 2A through 2C show steps in the erection of a microstructure 40 which includes a cantilever member 42 having an anchored end 43 supported on an anchor 44 and a free end 45. As shown in FIG. 2B, cantilever 42 is caused to buckle out of the plane of substrate 18 by applying a force that urges free end 45 toward anchor 44. The force may be applied using the tip of a wire bonding machine, probe station, or in some other suitable manner.

A latch comprising a stop member 46 is provided on substrate 18. Displacement of free end 45 is continued until free end 45 drops behind stop member 46. Stop member 46 holds cantilever 42 in the buckled configuration as shown in FIG. 2C after the force on free end 45 is discontinued. In the buckled configuration, a central region 47 of cantilever 42 is supported out of the plane of substrate 18. This central region may support one or more components such as:
- optical components such as mirrors;
- magnetic sensors;
- electronic components or sensors, for example, temperature sensors, optical sensors, radiofrequency coils, or the like;
- micromechanical components; and
- the like.

The latch mechanism may have any of a wide range of configurations. All that is required is some mechanism capable of holding free end 45 of cantilever 42 so that cantilever 42 retains its buckled configuration. In some embodiments, the latch mechanism comprises a fixed member such as a stop block or a recess formed in the substrate. In other embodiments, the latch mechanism comprises one or more members that move in the plane of the substrate and/or one or more members that move into and/or out of the plane of the substrate.

A latch mechanism may be fabricated, for example, using suitable micromachining or lithographic processes as are known to those of skill in the art.

Figure 3:
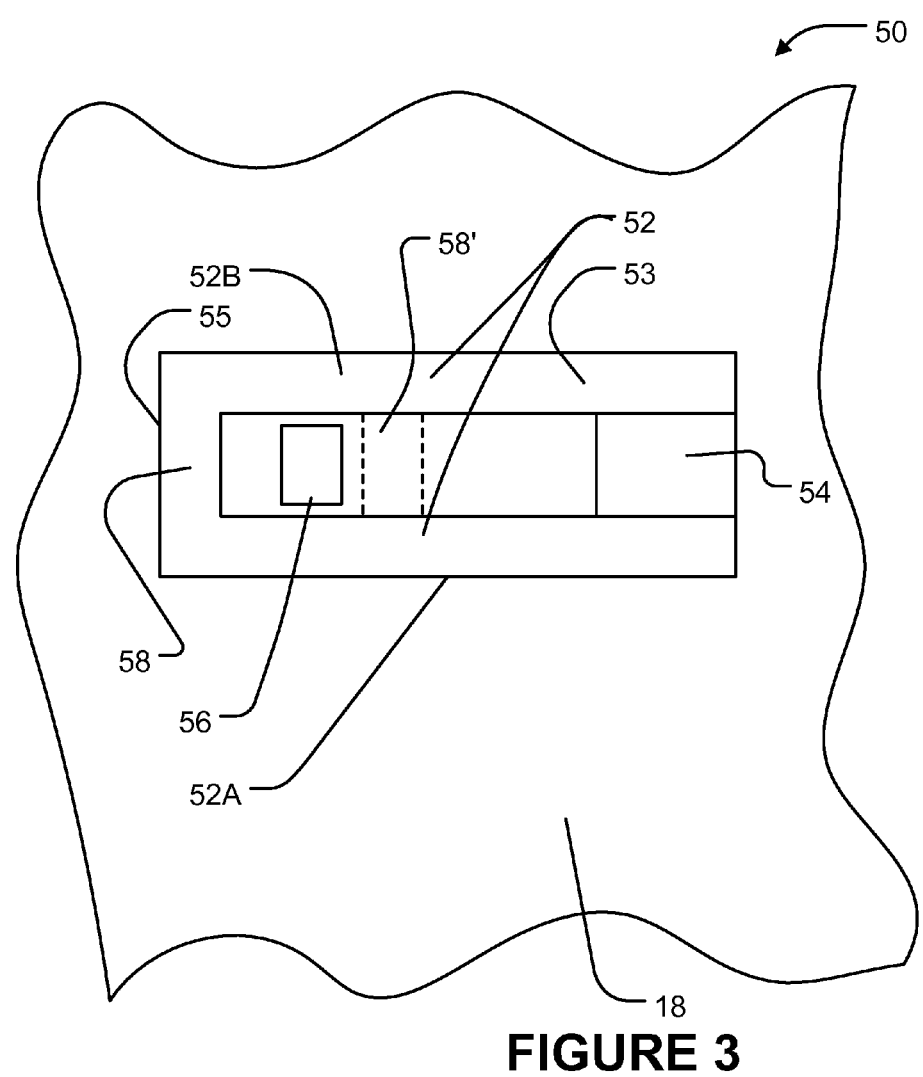
FIG. 3 shows a micromechanical structure according to an alternative embodiment from a viewpoint looking down onto substrate 18. The structure has first and second cantilever arms joined by a bridge.

FIG. 3 shows a micromechanical structure 50 according to an alternative embodiment from a viewpoint looking down onto substrate 18. Micromechanical structure 50 comprises a cantilever 52 comprising first and second cantilever arms 52A and 52B that are each anchored by an anchor 54 at an anchored end 53 and joined by a bridge 58 at free end 55. In other embodiments there are a plurality of bridging members. FIG. 3 shows bridging members 58 and 58' extending between cantilever arms 52A and 52B. A stop member 56 projects upwardly from substrate 18 between cantilever arms 52A and 52B.

Micromechanical structure 50 can be deployed by buckling cantilever arms 52A and 52B until bridge 58 can be hooked behind stop member 56.

Figure 3A:
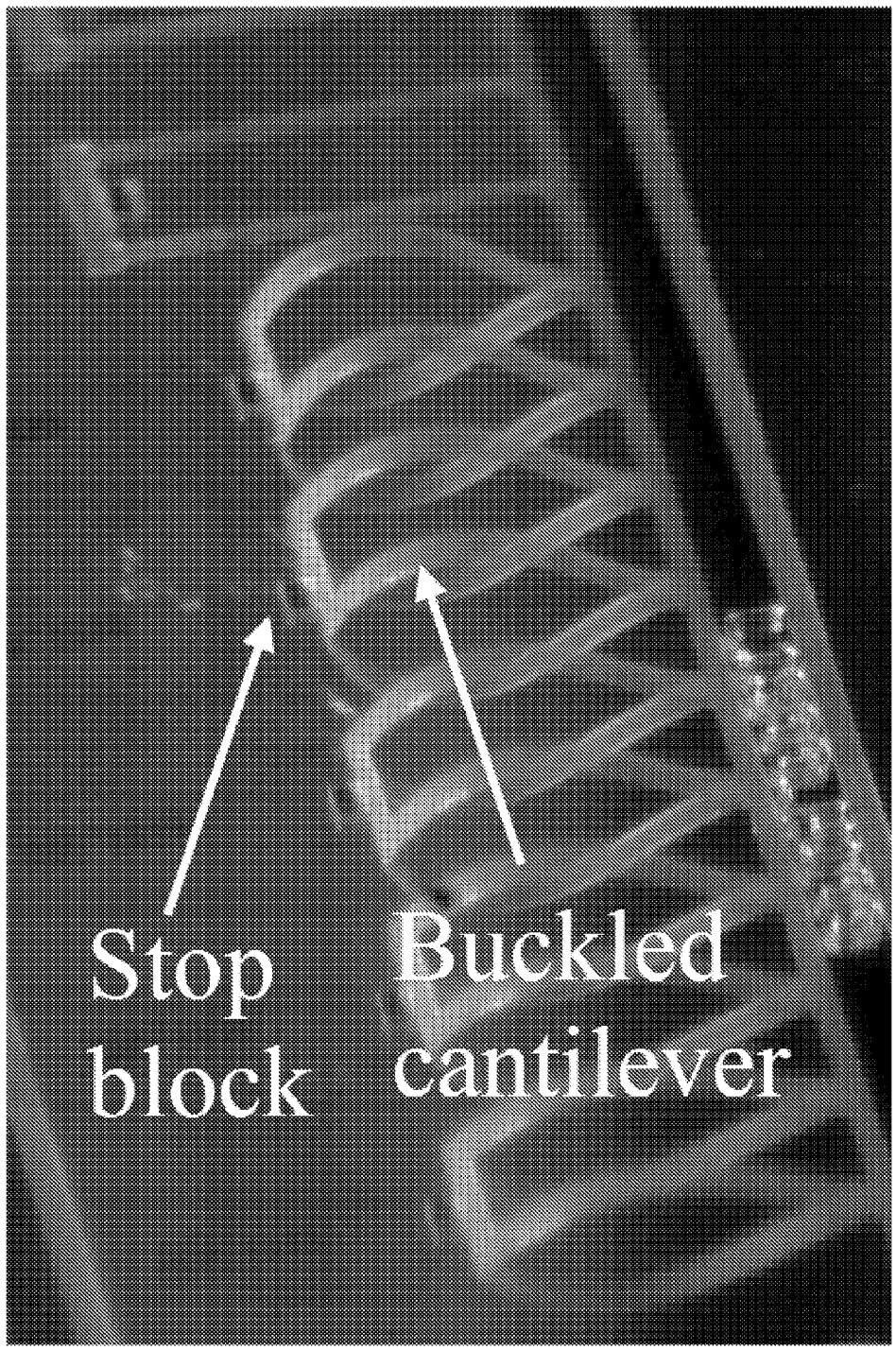
FIG. 3A is a microphotograph of a prototype buckled cantilever microstructure having a configuration like that shown in FIG. 3.

FIG. 3A is a microphotograph of a prototype buckled cantilever microstructure having a configuration like that of FIG. 3. The structure in FIG. 3A has cantilever arms 13 μm thick and having a nominal length of 1,000 μm. The cantilevers were pushed into their buckled configurations using the micromanipulator of a probe station. Each cantilever is locked in place by a 60 μm thick stop block.

Figure 4:
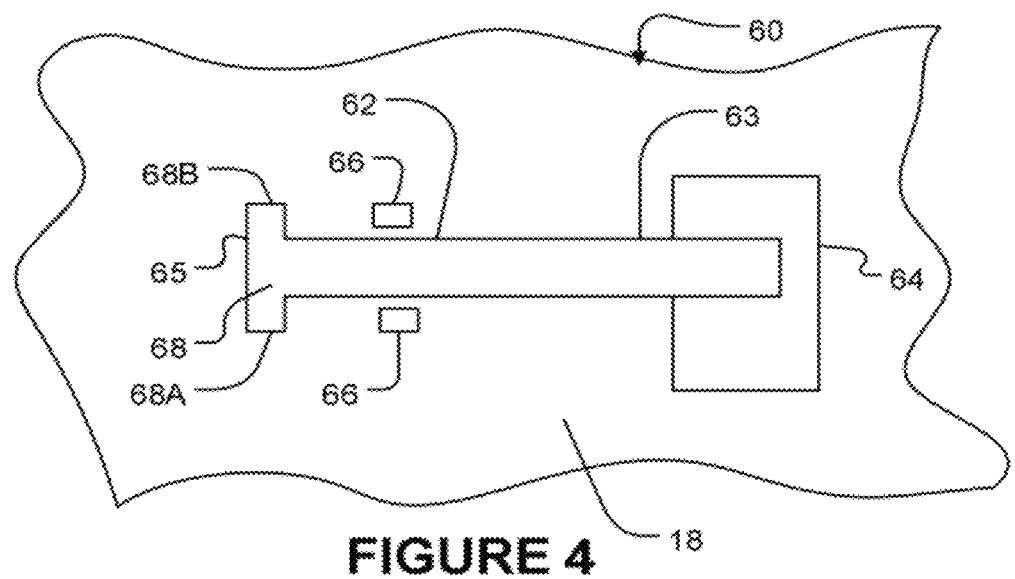
FIG. 4 is a schematic view of a microstructure according to an alternative embodiment wherein a cantilever has a free end carrying a head comprising lateral projections that can engage stop members on a substrate when the cantilever is buckled.

FIG. 4 shows a micromechanical structure 60 according to another embodiment. Structure 60 comprises a cantilever 62 supported on an anchor 64 at an anchored end 63 and having a free end 65 carrying a head 68 comprising lateral projections 68A and 68B. Latch mechanisms 66 are provided to engage projections 68A and 68B so as to retain cantilever 62 in a buckled configuration. Latch mechanisms 66 may comprise members projecting out of substrate 18, members projecting laterally toward cantilever 62 from a surrounding structure, or any other suitable mechanism for holding projections 68A and 68B.

The thickness of cantilever members in any embodiment of the invention may be selected so that cantilever arms can buckle without snapping or suffering other damage due to stress that occurs during buckling. The stiffness of cantilever members can be reduced by making the cantilever members thinner. In some embodiments, cantilever members (for example arms 52A and 52B shown in FIG. 3 or cantilever member 62 of FIG. 4) are thinner than 20 μm. In some embodiments, the cantilever member has a thickness in the range of 1 μm to 15 μm.

The length of the cantilever members may also be varied. The cantilever length will depend on the application, the cantilever material, and the process used to fabricate the cantilever among other design considerations. The cantilever members typically have lengths on the order of 1000 μm. The cantilever typically has a length in the range of 500 μm to 2000 μm. In some embodiments, the cantilever members have lengths of less than 2000 μm (less than 1300 μm in some cases). In some embodiments, the cantilever is fabricated using flexible circuit technology. In such embodiments the cantilever may have a length up to about 5000 μm and a thickness of up to about 50 μm.

Any of a wide range of materials may be used for cantilever members in embodiments of the invention. For example, cantilever members may be made of polysilicon, silicon oxide, other suitable dielectric materials, or suitable polyimides.

One can create microstructures using suitable semiconductor production equipment and semiconductor fabrication processes. Those skilled in the art of designing and making microstructures are aware of a full range of such equipment and processes. In some embodiments the microstructures may be fabricated using planar fabrication technologies such as the technologies that are dominant in the manufacture of integrated circuits (ICs). This is possible since the components of microstructures as shown in FIG. 1 may be fabricated substantially in-plane and erected subsequently.

Figure 5A:
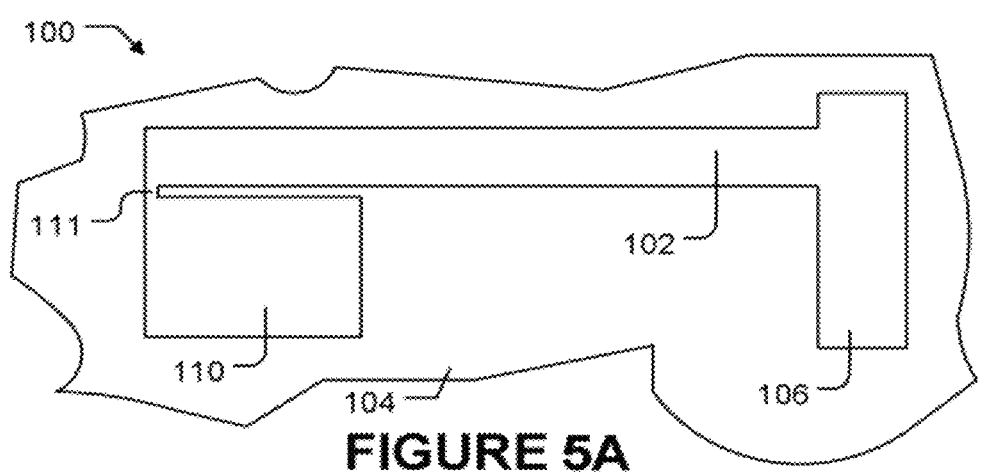
FIGS. 5A to 5I show microstructures according to alternative embodiments wherein a generally-planar sheet of material is attached to a cantilever at an isthmus that is relatively narrow compared to the sheet in a direction transverse to a bending axis of the cantilever.
Figure 5D:
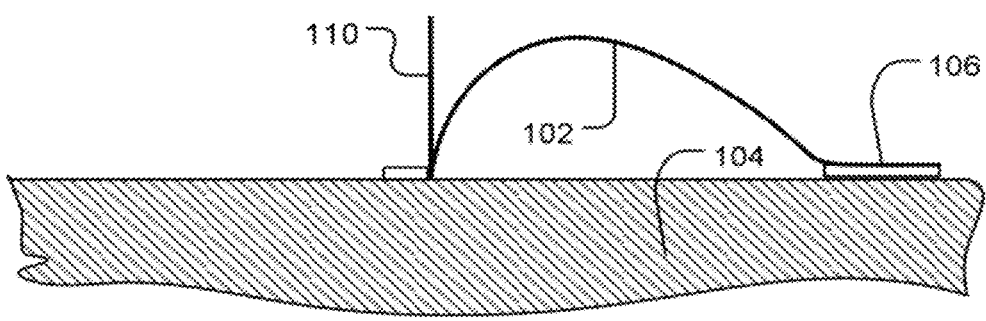
Figure 5B:
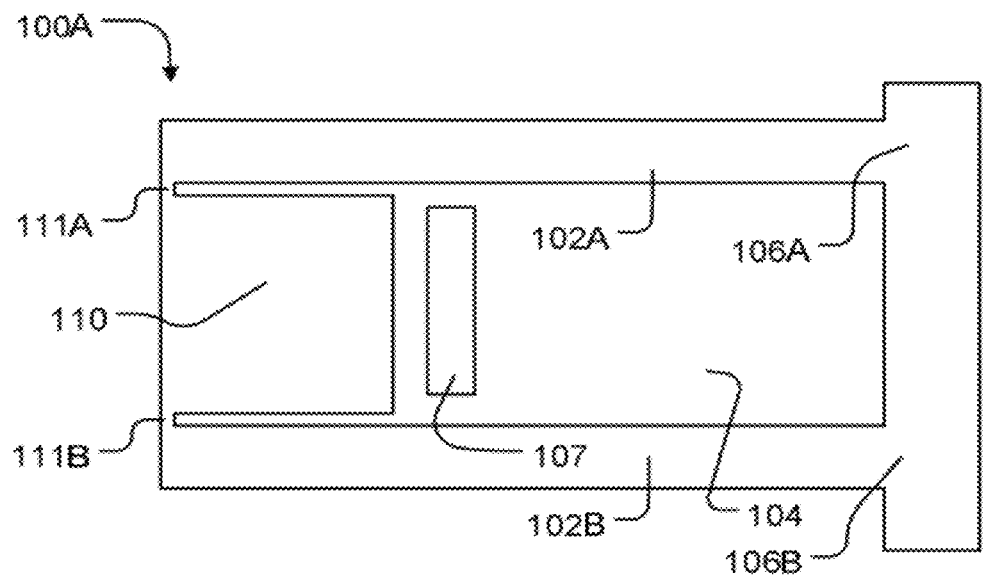
Figure 5E:
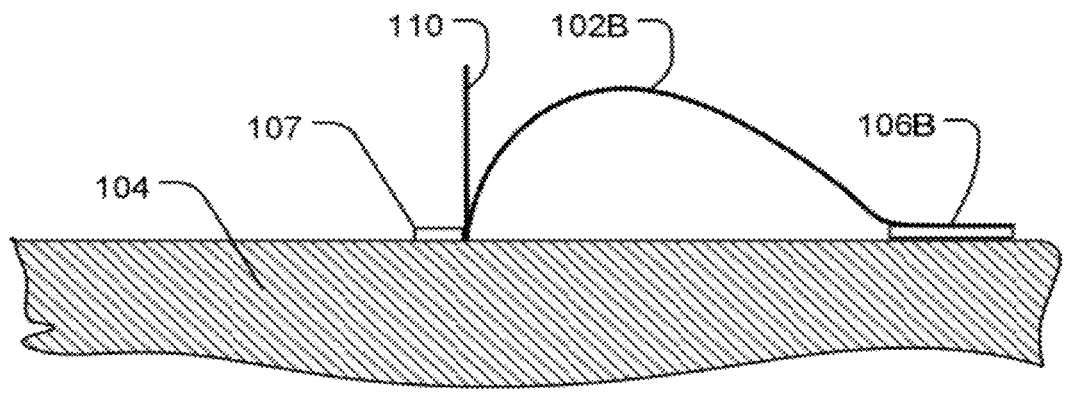
Figure 5C:
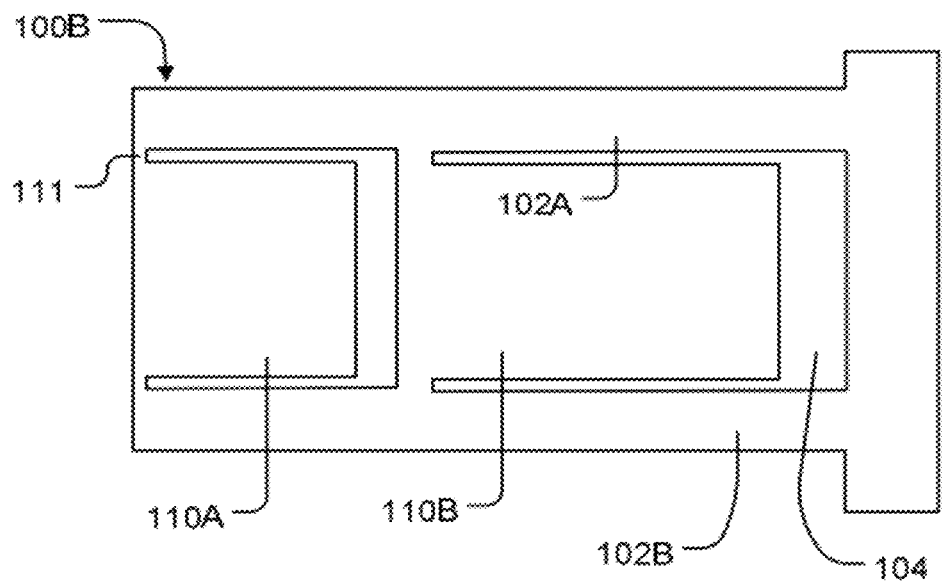
Figure 5F:
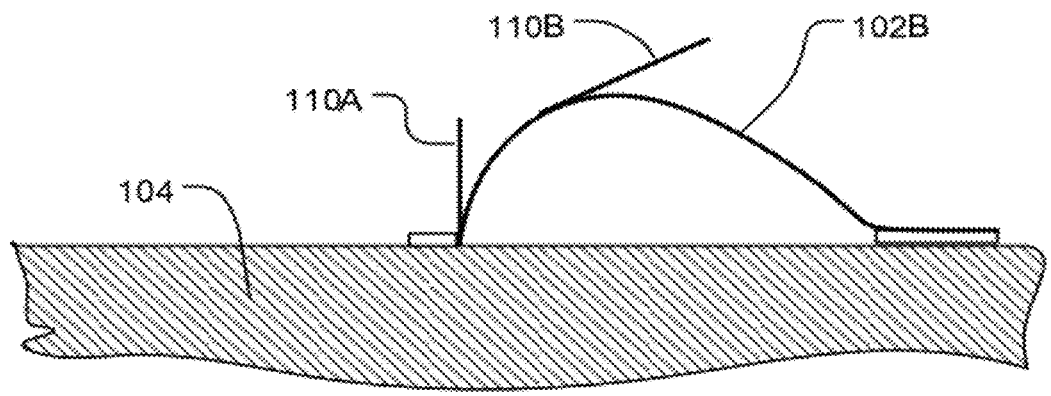

FIGS. 5A, to 5F show microstructures according to alternative embodiments wherein a generally-planar sheet of material is attached to a cantilever at an isthmus that is relatively narrow compared to the sheet in a direction transverse to a bending axis of the cantilever. FIG. 5A shows a plan view of a microstructure 100 prior to erection of the microstructure 100. Microstructure 100 has a cantilever 102 affixed to a substrate 104 at an anchor 106. A sheet 110 is connected to cantilever 102 by a narrow isthmus 111. Sheet 110 and isthmus 111 may be made of the same material. Since isthmus 111 is relatively narrow, sheet 110 is not bent very much when microstructure 110 is erected. The angle of sheet 110 to substrate 104 when microstructure 100 is erected is essentially the same as a tangent to the curved cantilever 102 at the point of connection to isthmus 111. By varying the location at which isthmus 111 is connected to cantilever 102 (and the degree of flex of cantilever 102 in its erected configuration) the angle made by sheet 110 to substrate 104 in the erected microstructure 100 can be designed to be between about zero (parallel to substrate 104) and about 90 degrees (at right angles to substrate 104. Isthmus 111 may be at any suitable location along cantilever 102. Isthmus 111 may be at any location along the edge of sheet 110 that extends beside cantilever 102.

FIG. 5B shows a microstructure 100A according to another embodiment wherein a sheet 110 is supported between two cantilevered portions 102A and 102B which are respectively anchored to substrate 104 at anchors 106A and 106B. Sheet 110 is respectively connected to cantilever portions 102A and 102B by isthmus portions 111A and 111B. A stop member 107 projects from substrate 104 between cantilever arms 102A and 102B.

FIG. 5C shows a microstructure 100B according to another embodiment wherein multiple sheet portions 110A and 110B are connected between cantilever portions 102A and 102B.

FIGS. 5D, 5E and 5F respectively show microstructures 100, 100A and 100B in their erected configurations. It can be seen that each sheet portion is held at an angle to substrate 104 and that the angle is essentially tangent to the cantilever portion to which the sheet portion is attached at the location of the isthmus joining the sheet portion to the cantilever portion.

The sheet portions are not necessarily rectangular or of any other shape. The sheet portions may be patterned to form antennas, lenses, components of microphones or the like. The sheet portions may support electrical components, heat sensors, flow sensors, accelerometers or the like. The sheet portions may be apertured.

Figure 5G:
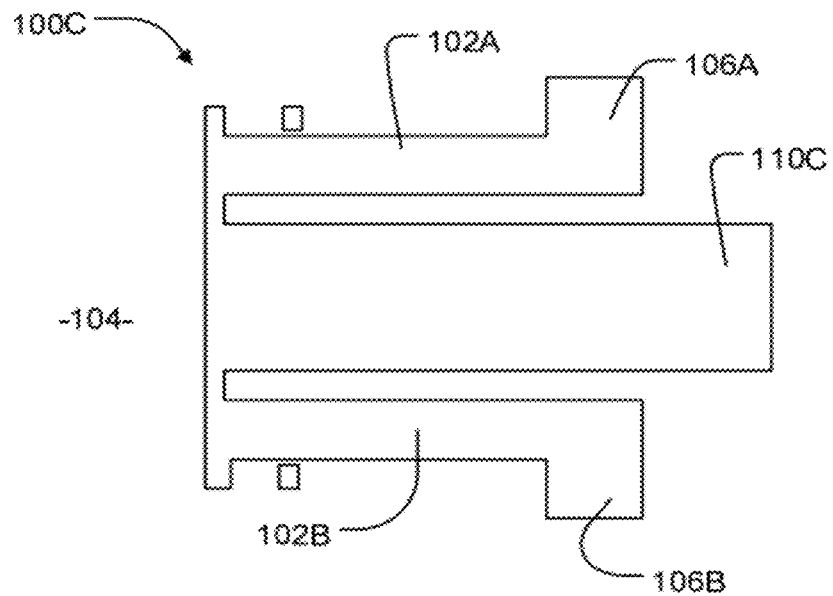
Figure 5H:
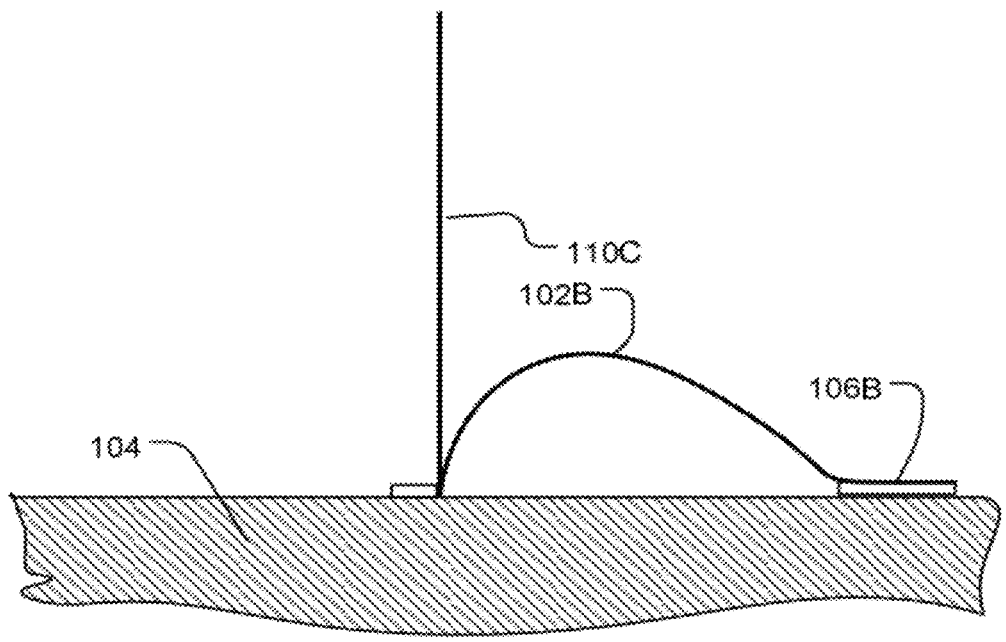

As shown in FIGS. 5G and 5H, a sheet portion may be longer than the cantilevers that support it. FIG. 5G shows a microstructure 100C wherein a sheet portion 110C is connected between two cantilevered portions 102A and 102B which are respectively anchored to substrate 104 at anchors 106A and 106B. Sheet portion 110C extends between anchors 106A and 106B and is longer than cantilevered portions 102A and 102B.

Figure 5I:
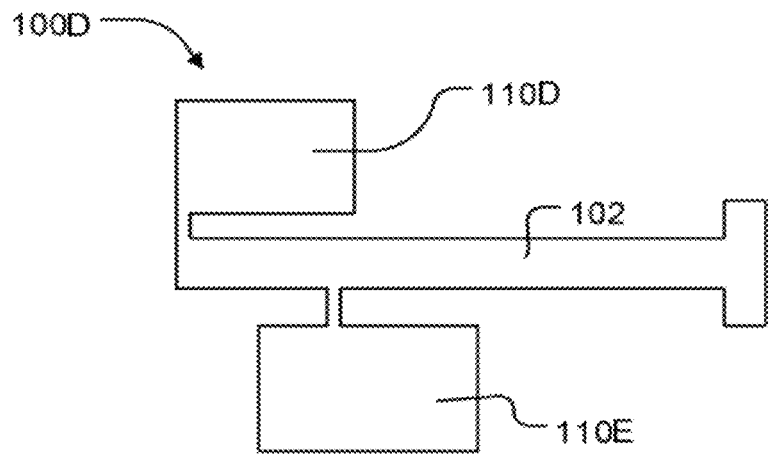

As shown in FIG. 5I, sheet portions may be connected to both sides of a cantilever. In the microstructure 100D of FIG. 5I, a sheet portion 110D is connected on a first side of cantilever 102 and a sheet portion 110E is connected on a second side of the cantilever 102.

Figure 6A:
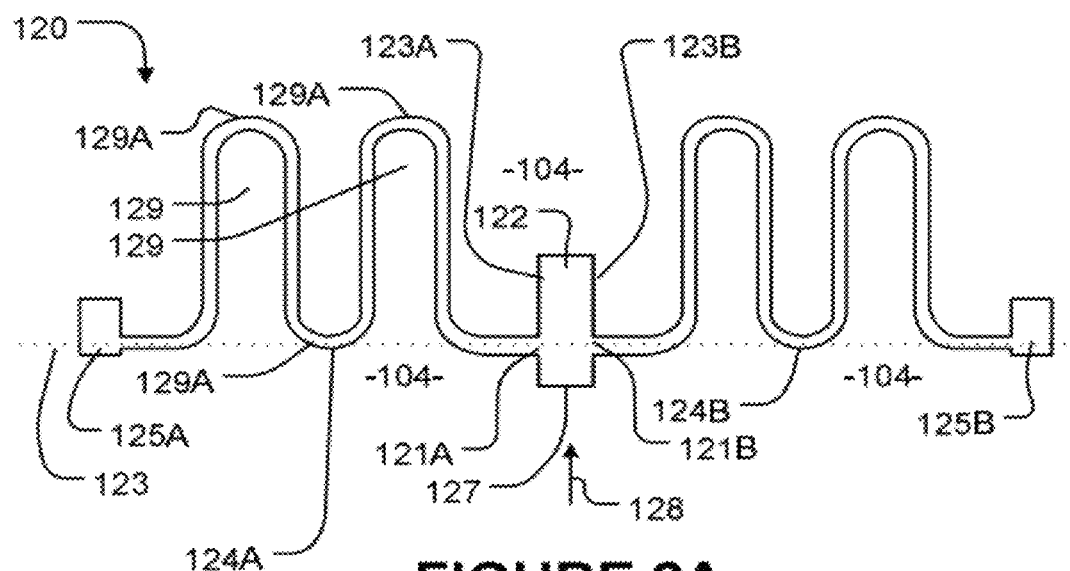
FIGS. 6A through 6E show alternative embodiments in which a member is coupled to anchor points on a substrate by serpentine springs which connect to opposing sides of the member.
Figure 6B:
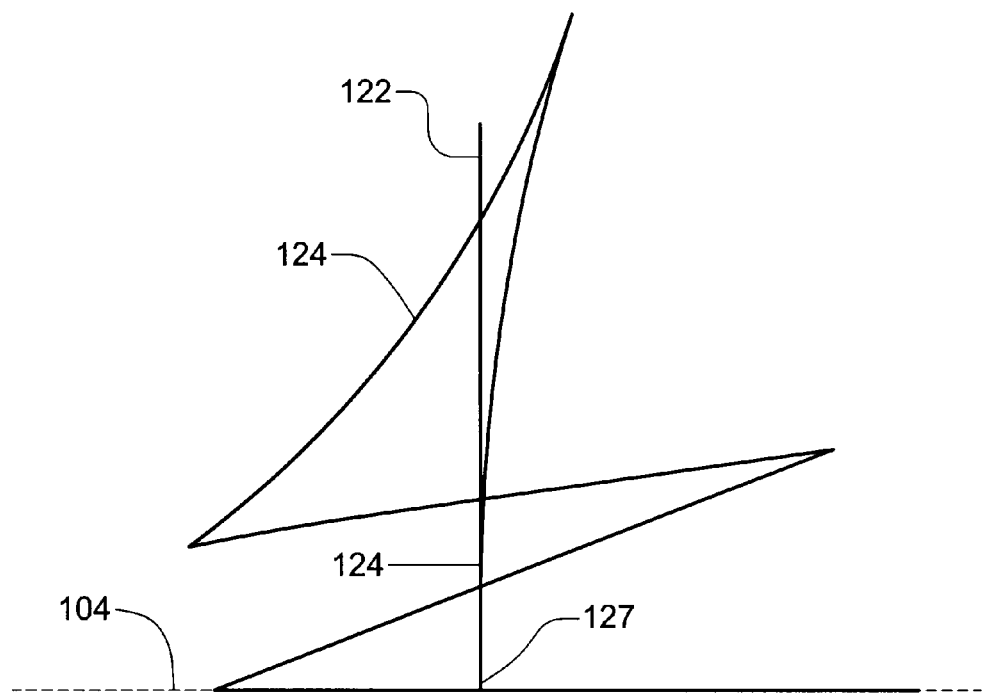
Figure 6C:
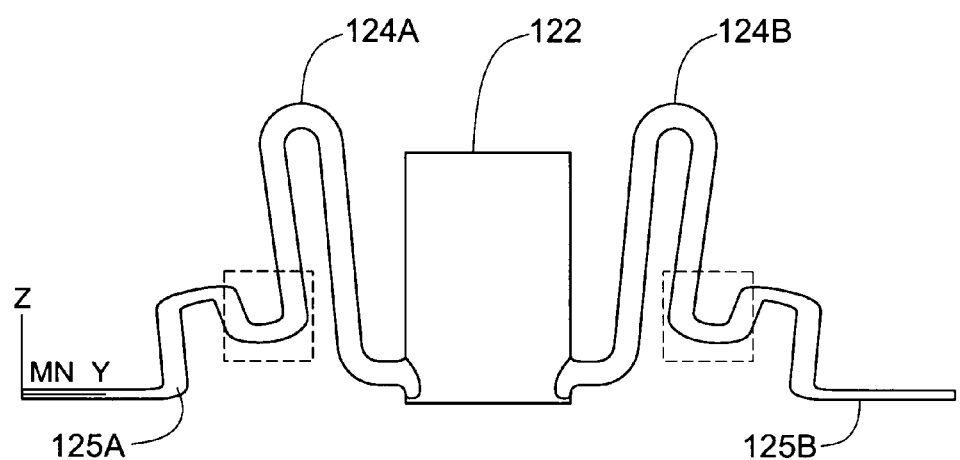

FIGS. 6A through 6C show alternative embodiments of the invention in which a member is coupled to anchor points on a substrate by serpentine springs which connect to opposing sides of the member. The serpentine springs constitute resiliently deformable flexible elements. The member and springs may be integral with one another. Examples of the embodiments like those shown in FIGS. 6A to 6C are described in S. H. Tsang et al. *Automated Assembly of Hingeless 90° Out-of-Plane Microstructures* J. Micromech. Microeng. 17 (2007) 1314-1325 which is hereby incorporated herein by reference.

FIG. 6A shows a plan view of a microstructure 120 in a non-erected configuration. Microstructure 120 comprises a member 122 connected to substrate 104 by serpentine springs 124A and 124B (collectively springs 124). Springs 124A and 124B have first ends respectively connected to attachment points 121A and 121B on opposing edges 123A and 123B of member 122. Springs 124A and 124B have second ends connected to substrate 104 at anchor points 125A and 125B respectively.

Springs 124 are relatively stiff in the in-plane direction (i.e. the springs are stiff in relation to displacements of member 122 parallel to substrate 104 when microstructure 100 is in its unerected configuration). Springs 124 are relatively compliant in the out-of-plane direction. This may be achieved by making the springs to have a height smaller than a width. In example embodiments, the ratio of height to width is 1:2 or 1:3. The ratio is in the range of 1:1.5 to 1:4 in some embodiments. Since stiffness scales as the cube of thickness (other factors being equal) these thickness ratios translate approximately to ratios of stiffness in the in-plane and out-of-plane directions in the range of 1:3.4 to 1:64. The example embodiments described herein have stiffness ratios of about 1:8 and 1:27.

The dimensions of springs 124 will depend upon the material from which springs 124 are fabricated as well as design requirements. In example prototype embodiments where springs 124 were made by the PolyMUMPS process, springs 124 had cross-sectional dimensions of 2 μm thick by 4 μm wide. In example prototype embodiments where springs 124 were made by the SU-8 process, springs 124 had cross-sectional dimensions of 20 μm thick by 60 μm wide.

PolyMUMPs is a three-layer polysilicon surface and bulk micromachining process, with 2 sacrificial layers and one metal layer. Eight mask levels create 7 physical layers. The PolyMUMPS process is described in Koester, A. C. David et al. *PolyMUMPS Design Handbook*, MEMSCAP 2003. Example material characteristics for a layer of material formed by the PolyMUPMs process are a Young's modulus of 158 GPa and a Poisson's ratio of 0.22. SU-8 is a photoresist material that can be patterned to make MEMS devices. SU-8 is available from Michrochem Corporation. The use of SU-8 to make MEMS devices is described in Lorenz, H. et al. *SU-8: A low-cost negative resist for MEMS*, J. Micromech. Microeng. V. 7, pp. 121-4, 1997 and Sameoto, D. et al., *Polymer MEMS processing for multi-user applications* Sensors Actuators A v. 134 pp. 457-64 (2007).

Figure 6D:
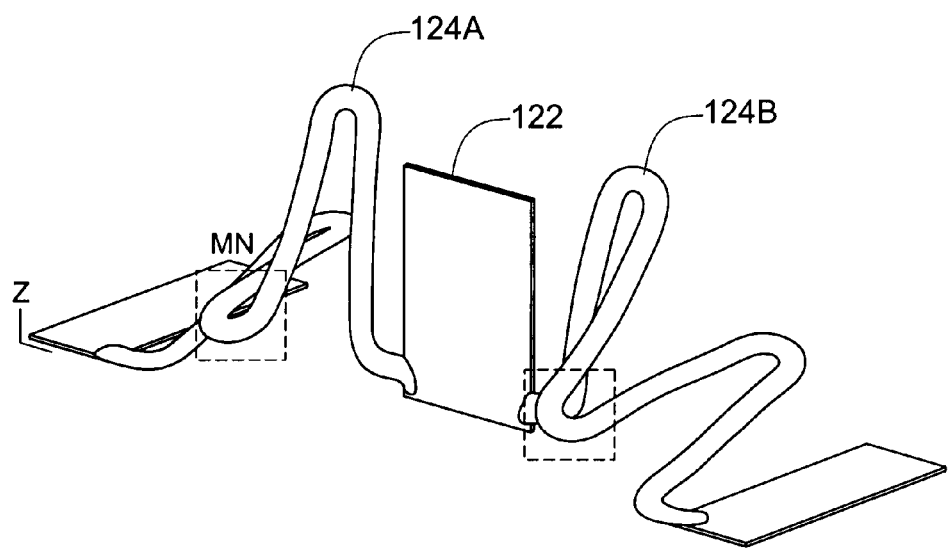

FIG. 6B shows a side view of microstructure 120 in an erected configuration. FIG. 6C is a front view of microstructure 120 in the erected configuration. Microstructure 120 can be erected by displacing edge 127 of member 122 in the direction of arrow 128. As this occurs, springs 124A and 124B resist the lateral movement of member 122. Since springs 124 are much stiffer in the in-plane direction than in the out-of-plane direction, any perturbation as the force is applied will cause member 122 to begin to tilt away from substrate 104. The displacement of edge 127 may be continued until member 122 is perpendicular to the surface of substrate 104 as shown in FIGS. 6B, 6C and 6D. As edge 127 is moved along substrate 104 and member 122 tilts and springs 124 bend.

It can be seen in FIG. 6A that, in the illustrated embodiment, springs 124 each have the form of two connected U-shaped bends. The loops form two bights 129 on the side of springs 124 facing away from edge 127. Each spring has three hairpin bends 129A, with two of those hairpin bends on the side away from edge 127.

Figure 7A:
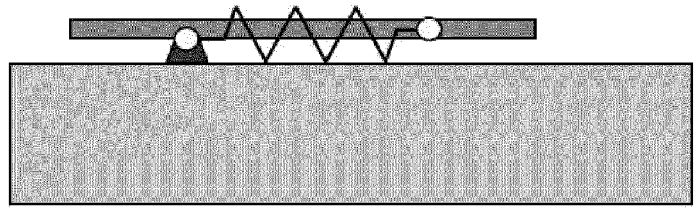
Figure 7B:
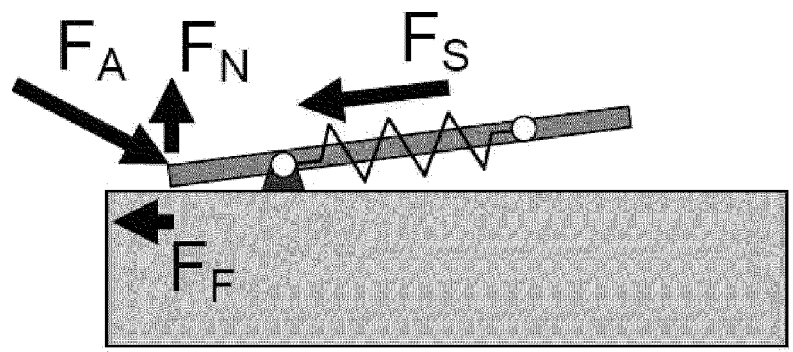
Figure 7C:
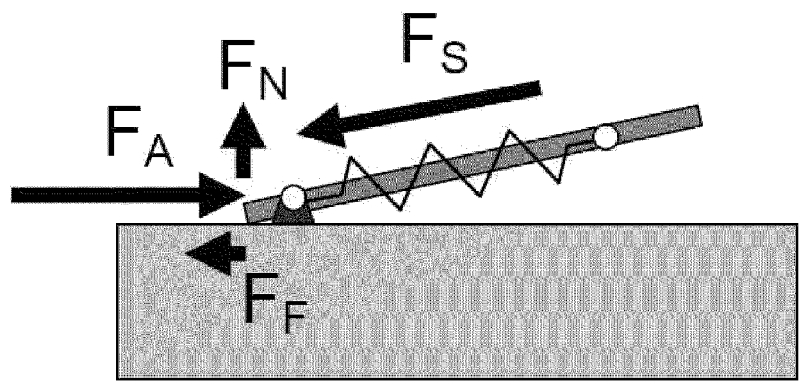

Once microstructure 120 has been erected, friction between edge 127 and substrate 104 keeps microstructure 120 in its erect configuration. FIGS. 7A through 7F are force diagrams which illustrate the forces acting upon member 122 as it is moved from its non-erected configuration to its erected configuration by the application of a lateral force $F_A$ to edge 127. It can be seen that, as the angle between member 122 and substrate 104 increases, the force $F_S$ applied by springs 124A and 124B increases and the normal component $F_N$ of the force between edge 127 and substrate 104 also increases. When member 122 is substantially perpendicular to substrate 104 as shown in FIG. 7F, $F_N$ is equal to $F_S$. As member 122 reaches its erect position, the component of force $F_Y$ exerted by springs 124 on member 122 in a "Y" direction parallel to the local surface of substrate 104 decreases. When member 122 is erect, the portions of springs 124 that connect to member 122 are most compliant in the Y direction.

As shown in FIG. 6A, a line 123 extending between the points of connection of springs 124 to member 122 defines a pivot axis about which member 122 can rotate as it is erected. Pivot axis 123 is spaced apart from edge 127 by a displacement D. The distance between line 123 and edge 127 is one factor that affects the force $F_S$ applied when microstructure 120 is in its erect configuration as shown in FIGS. 6B and 6C. This force, in turn affects the frictional force that resists return of microstructure 120 to its non-erect configuration.

The frictional force between edge 127 and substrate 104 is given by:

$$F_F = \mu F_N$$

where $F_F$ is the frictional force and $\mu$ is the coefficient of friction. Where the force of gravity acting on member 122 is insignificant compared to the normal component of $F_S$ it is a condition for stability that:

$$\mu \geq \frac{F_Y}{F_Z} \quad (2)$$

where $F_Y$ is the magnitude of the component of the force exerted by springs 124 that tends to move edge 127 along the surface of substrate 104 when member 122 is in its erected configuration and $F_Z$ is the force with which springs 124 press member 122 against substrate 104. For various example prototype microstructures having the structure generally as shown in FIGS. 6A to 6C, minimum values for $\mu$ were determined to be in the range of about 0.18 to about 0.3. By contrast, the static coefficient of friction of polysilicon on polysilicon is 4.9.

The resistance of microstructure 120 to shock depends upon the mass of member 122 as well as on the force of friction between edge 127 and substrate 104. If a shock accelerates substrate 104 at an acceleration such that $F_N$ is reduced to a point at which the microstructure is not stable or to a point that the inertia of member 122 overcomes the frictional force holding edge 127 in position against substrate 104 then microstructure 120 could collapse when exposed to such shock. The erected structure is most susceptible to shock in accelerations in the –Z direction (i.e. the substrate is accelerated away from member 122. The mass of member 122 can, however, be very small such that microstructure 120 can survive very large shock accelerations. The shock acceleration required to reduce $F_Z$ to zero can be determined by:

$$F_{shock} = ma = \rho V a = F_Z$$

where $\rho$ is the density of member 122, V is the volume of member 122, a is the shock acceleration and $F_{shock}$ is the effective force on member 122 resulting from the shock acceleration. Using the values $\rho = 2.3 \times 10^3$ Kg/m$^3$ (the density of silicon) and an example volume of $3.7 \times 10^{-14}$ m$^3$ yields an acceleration of $2.63 \times 10^6$ or about 270,000 times the acceleration of gravity.

Example devices having the characteristics in Table I have been studied using finite-element simulations.

TABLE I

Characteristics of prototype embodiments

| Design Process | Spring length (μm) | Distance to spring Connection point-D (μm) | Displacement for assembly (μm) | Max. von Mieses stress (MPa) | μ Min | $F_Z$ (mN) | $F_Y$ (mN) |
|---|---|---|---|---|---|---|---|
| PolyMUMPS | 110 | 34 | 78 | 2.96 | 0.18 | 0.22 | 0.04 |
| PolyMUMPS | 130 | 34 | 85 | 2.71 | 0.25 | 0.16 | 0.04 |
| PolyMUMPS | 110 | 14 | 70 | 2.07 | 0.23 | 0.13 | 0.03 |
| SU-8 | 700 | 40 | 355 | 0.014 | 0.3 | 2.03 | 0.61 |

The simulations used the material properties in Table II.

TABLE II

Material Properties

| Process | Elastic Modulus (GPa) | Poisson's Ratio | Yield Strength (MPa) | Density (KG/m$^3$) |
|---|---|---|---|---|
| PolyMUMPS | 158 ± 10 | 0.22 ± 0.01 | 1210 ± 800<br>1650 ± 280 | 2300 |
| SU-8 | 39117 | 0.22-0.33 | 50-70 | 1190 |

In the PolyMUMPs designs the springs had thicknesses of 2 μm and widths of 4 μm. In the SU-8 designs the springs had thicknesses of 20 μm and widths of 60 μm.

The maximum stress experienced by springs 124 may be reduced by making springs 124 longer. A trade off is that, other factors being equal, the minimum coefficient of friction required to ensure stability of the microstructure in the erected configuration increases as the springs are made longer.

Prototype embodiments according to the PolyMUMPS and SU-8 designs have been repeatedly moved between their non-erected and erected configurations with no apparent ill effects. In one experiment a single prototype device was cycled 220 times without failure.

Figure 6E:
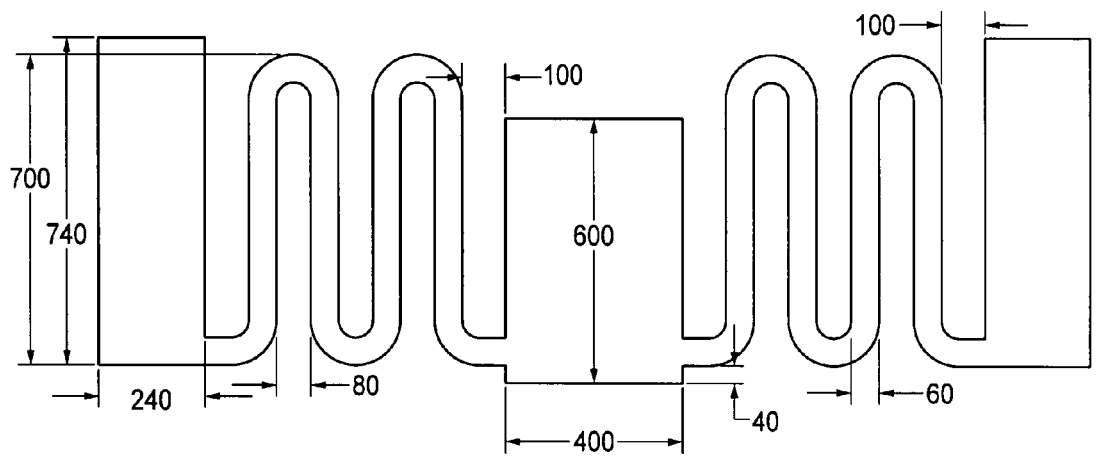

FIG. 6E shows dimensions (in μm) for an example prototype microstructure 120. The microstructure has a thickness of 20 μm.

An erectable structure of the type shown in FIGS. 6A to 6E may optionally comprise a stop projecting from substrate 104 at a location such that edge 127 abuts against the stop when the structure has been erected. Such a stop can assist to ensure that the structure can be repeatably erected in a desired configuration. The stop may be positioned so that edge 127 of member 122 abuts the stop when member 122 is vertical relative to substrate 104 or at some other desired angle to substrate 104.

Erectable structures of types as described herein may be applied in a wide range of micro devices. For example, such structures may support optical or antenna components or sensors out of the plane of a substrate. Another example application of the erectable structures as described herein is accelerometers. A Z-axis accelerometer (which may be a component of a two- or three-axis accelerometer) is an example application of the 3-D micro structures described herein. Such an accelerometer may operate according to the principles explained in Leung, Albert M., U.S. Pat. No. 6,666, 088 entitled Accelerometer without proof mass issued Dec. 23, 2003. Temperature sensors for a third axis may be supported on a buckled cantilever or on a member supported by a buckled cantilever, as described herein. Another aspect of the invention provides Z-axis accelerometers having features as described herein.

Figure 8:
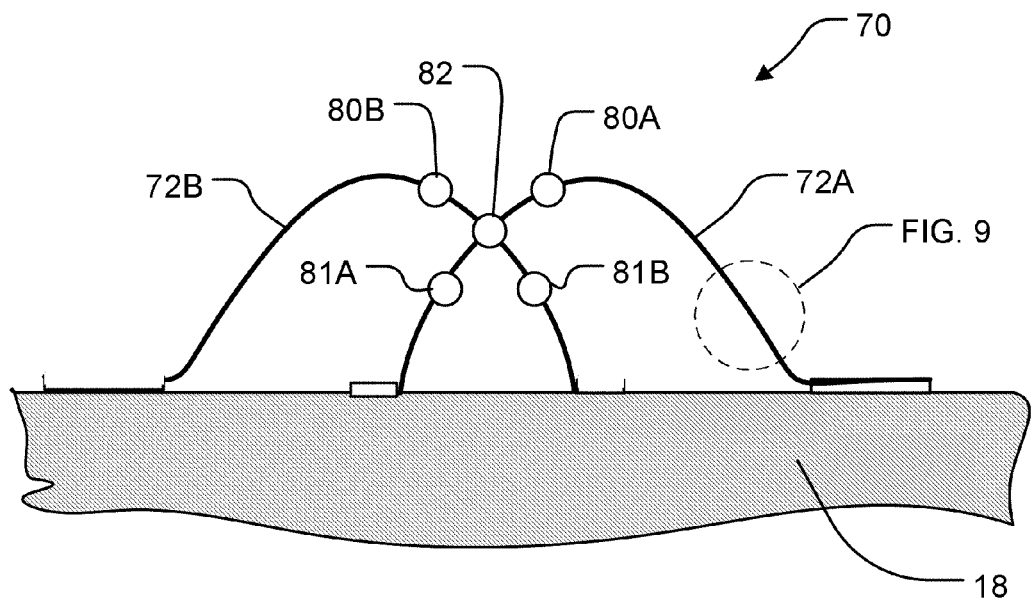
FIGS. 8 and 8A show an example third-axis accelerometer structure in which buckled cantilevers support heaters and temperature sensors.

FIG. 8 shows an example third-axis accelerometer structure 70. Buckled cantilevers 72A and 72B each support two temperature sensors. Cantilever 72A supports an upper temperature sensor 80A and a lower temperature sensor 81A. Cantilever 72B supports an upper temperature sensor 80B and a lower temperature sensor 81B. Each cantilever supports a heater 82 between its upper and lower temperature sensors. In the illustrated embodiment, cantilever 72A is close to and in front of cantilever 72B.

Figure 8A:
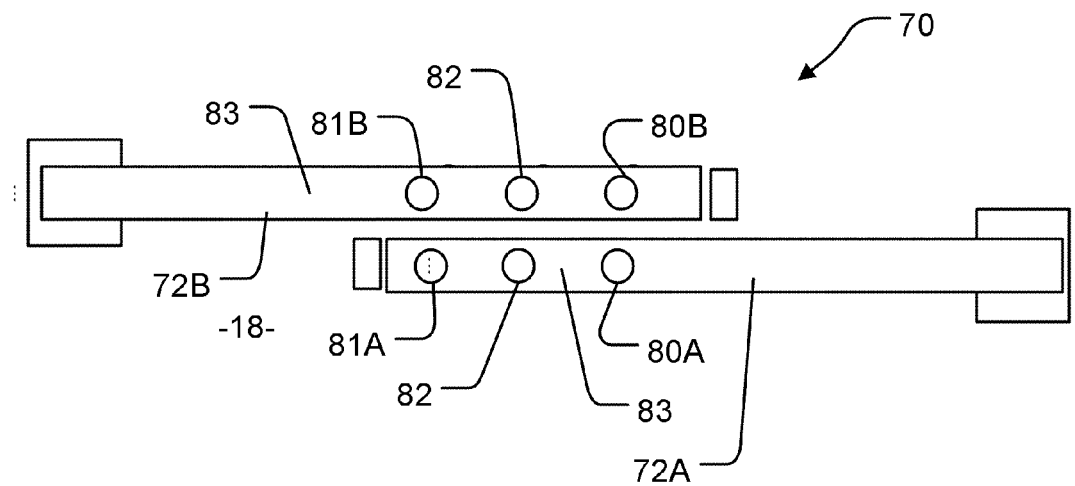

Electrically-conducting traces (indicated schematically by 83 in FIG. 8A) may be provided on the buckled cantilevers for the purpose of carrying electrical signals and/or electrical power to and from components on the buckled cantilevers. The traces may extend along the buckled cantilevers from the anchored ends of the buckled cantilevers and may interconnect with other electrically-conducting pathways and components that are on or in the substrate. Multiple traces may extend along each cantilever.

In a prototype embodiment, each cantilever is fabricated from a 2-D structure comprising upper and lower polyimide layers 74 and 75 (see FIG. 9) with 0.05-0.1 μm thick thin-film metal layers (NiCr and Ni) 76 sandwiched between them. The patterned NiCr and NiCr—Ni layers form heaters 82 and thermopile temperature sensors 80 and 81. Conducting pathways may be made of any suitable metals and/or semiconductors and are not limited to NiCr and NiCr—Ni. The material of the cantilevers in the prototype is SU-8, which is a relatively "soft" photo-definable polymer material. The cantilevers are not limited to the SU-8 material however.

In some embodiments, the material of the cantilever is selected to have a coefficient of thermal expansion similar to that of substrate 18. For example, where substrate 18 comprises silicon, the cantilever may be made of DuPont Pyralin LX PI-2610D polyimide, which has a relatively low coefficient of thermal expansion of 3 ppm/° C. that is comparable to that of silicon. The cantilever material may be applied and patterned to form the cantilever by any suitable technique. In some embodiments, the material of the cantilever is applied by spin coating. An adhesion promoter may be applied to assist in adhesion of the cantilever material to the substrate.

The heater 82 top-right temperature sensor 80A and bottom-left temperature sensor 80B are basic elements of a Z-axis thermal accelerometer. The shape of buckled cantilever 72A does not allow perfect alignment of temperature sensors 80A and 81A along the Z axis. The effect of this misalignment can be reduced or eliminated by providing second buckled cantilever 72B and its associated heater 82 and temperature sensors 80B and 81B. Second buckled cantilever 72B is a mirror image of first buckled cantilever 72A the Z axis. Consequently its temperature sensors provide sensitivity to acceleration along the Z-axis in the same direction as do the temperature sensors of first cantilever 72A but the sensitivity is the X-axis direction is of opposite polarity. Summing the signals from the temperature sensors of first and second cantilevers 72A and 72B doubles the Z-axis output and suppresses X-axis outputs to substantially eliminate the misalignment effects.

Since acceleration can be determined by studying differences in temperature between temperature sensors 80 and 81, temperature sensors 80 and 81 may respectively comprise hot and cold junctions of a thermocouple, or vice versa. Any other suitable temperature sensors may be used.

Structures like those shown in FIGS. 5A to 5F or FIGS. 6A through 6E may also be used to support components of a one- or two-axis accelerometer. For example, FIG. 8B shows a one-axis thermal accelerometer 200 based on heater(s) and thermocouple(s) fabricated on a sensor plate 202 that is held in an erect position by two buckled cantilevers 204A and 204B. Electrical conductors 206 run from a substrate 208 along cantilevers 204A and 204B to heaters 210 (in the illustrated embodiment there are two symmetrically-located heaters 210) and a first temperature sensor 212A on sensor plate 202. Temperature sensor 212A detects a temperature differential between points lying along a line 213A. In the illustrated embodiment, temperature sensor 212A comprises a thermocouple having one set of junctions lying along the edge of temperature sensor 212A that is away from substrate 208 and a second set of junctions lying along the edge of temperature sensor 212A that is closer to substrate 208. In the illustrated prototype, sensor plate 202 is fabricated from a thin layer of polyimide deposited on a silicon substrate.

A two-axis accelerometer may be made by providing another temperature sensor 212B (see FIG. 8C) to detect a temperature differential between points on a second line 213B. The temperature sensors may each comprise one or more thermocouples, for example.

Figure 8C:
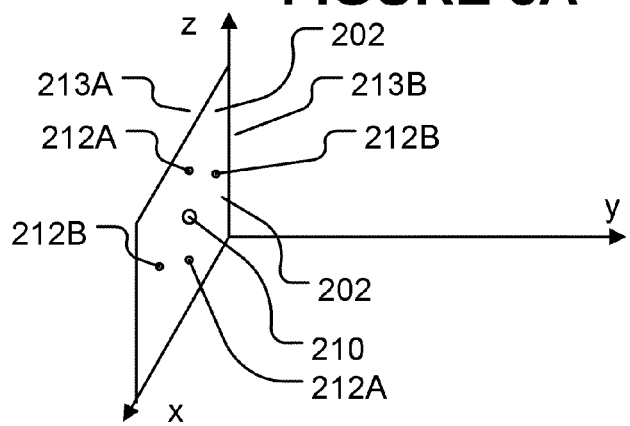
FIG. 8C is a schematic view of a two-axis accelerometer.
Figure 8B:
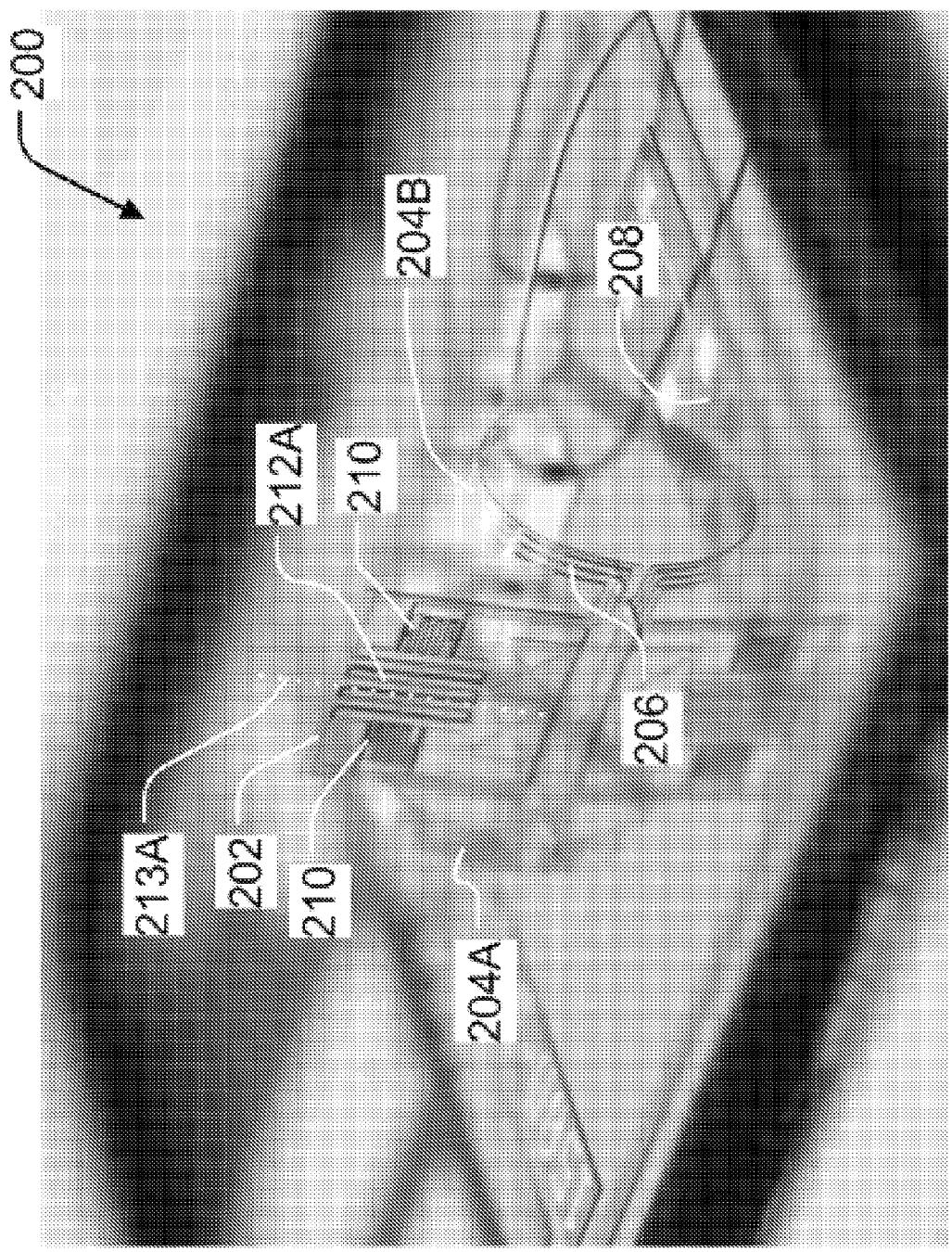
FIG. 8B is a view of a one-axis accelerometer.

FIG. 8C provides a schematic representation of a two axis accelerometer similar to z-axis accelerometer 200. Only sensor plate 202, heater 210 and first and second temperature sensors 212A and 212B are shown in FIG. 8C. The output of first temperature sensor 212A, $V_{TC1}$ is given by:

$$V_{TC1}=ka_z=k_{at} \times k_{tv} \times a_z \qquad (4)$$

where: $a_z$=acceleration in the z axis; $k=k_{at}k_{tv}$=sensitivity; $k_{at}$=acceleration to temperature conversion constant; and, $k_{tv}$=temperature to voltage conversion constant (which typically equals the Seebeck coefficient times the number of thermocouples in first thermocouple sensor 212A).

A single sensor plate 202 can support components of accelerometers for measuring acceleration in two directions in the plane of sensor plate 202. In the illustrated embodiment, line 213B along which second temperature sensor 212B is oriented has a direction orthogonal to that of line 213A. This permits the illustrated sensor to detect acceleration in both z and x directions. The output, $V_{TC2}$ of second temperature sensor 212B is given by:

$$V_{TC2}=k \times a_x \qquad (5)$$

where: $a_x$=acceleration along the x axis; and k=sensitivity. The sensitivity along different axes is not necessarily the same.

Figure 8D:
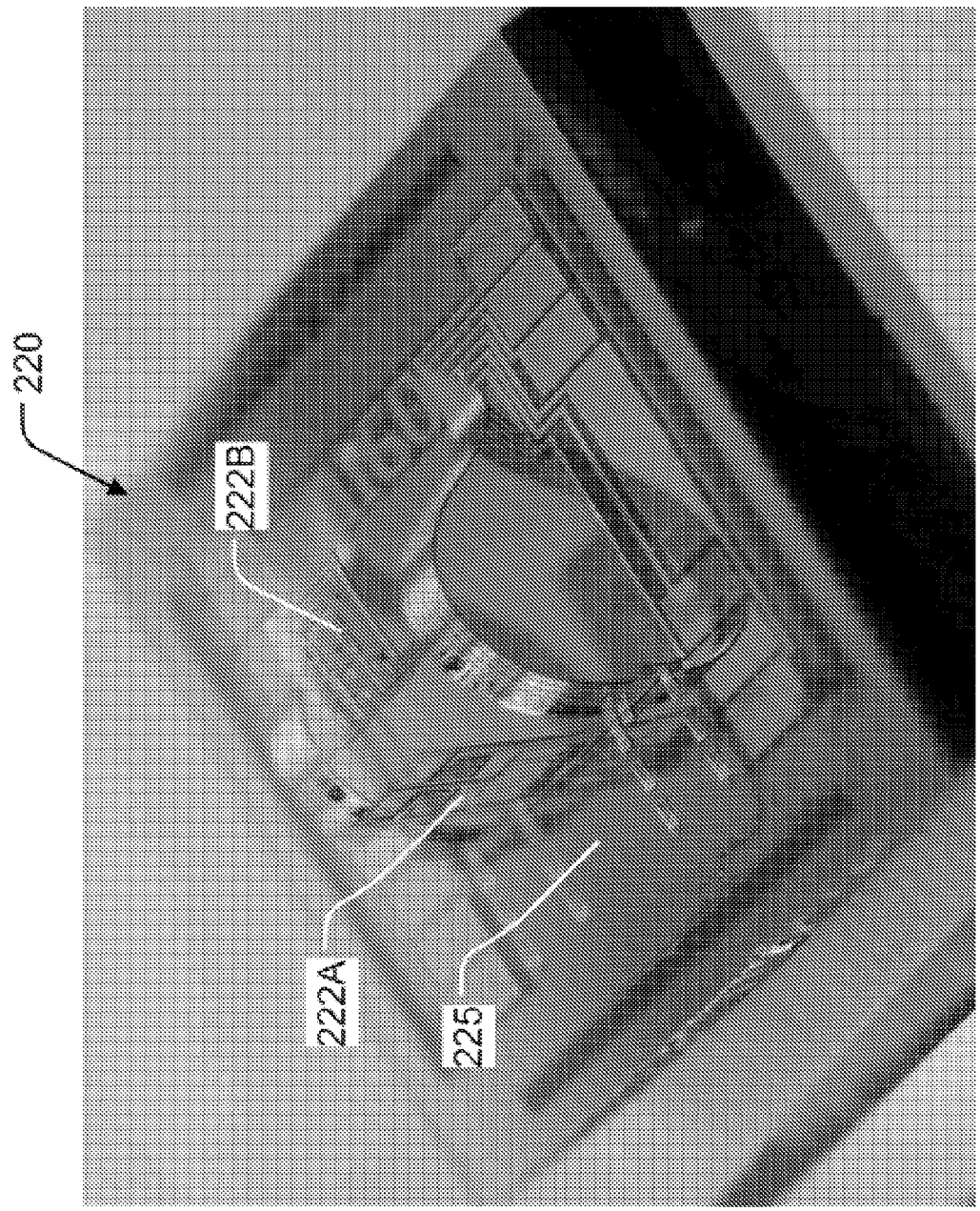
FIG. 8D is a microphotograph of a three-axis accelerometer according to an embodiment of the invention.

FIG. 8D shows an accelerometer structure 220 comprising sensor plates 222A and 222B. Plate 222A is more-or-less at right angles to substrate 225 while plate 222B is supported away from and more-or-less parallel to substrate 225. Plates 222A and 222B can support heaters and temperature sensors in an arrangement capable of detecting acceleration in each of three orthogonal axes x, y and z.

Figure 8E:
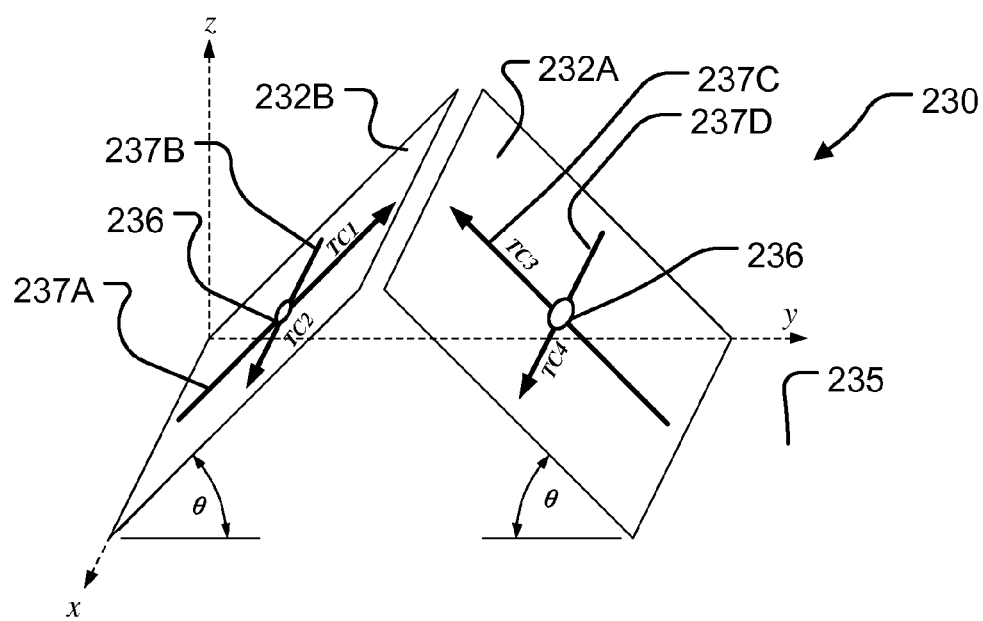
FIGS. 8E, 8F and 8G are views of three-axis accelerometers according to embodiments of the invention.

FIG. 8E shows another accelerometer structure 230 comprising sensor plates 232A and 232B that are located symmetrically relative to one another. In the illustrated embodiment, sensor plate 232A is a mirror image of sensor plate 232B. Each sensor plate 232A and 232B is supported at an angle θ to substrate 235. Each sensor plate supports a heater 236 and two temperature sensors. Accelerometer 230 has four temperature sensors TC1, TC2, TC3 and TC4 that sense temperature differentials along lines 237A, 237B, 237C and 237D respectively.

It can be shown that accelerations in the x, y and z directions can be determined as follows:

$$a_x = [V_{TC1} + V_{TC2}]/2k \quad (6)$$

$$a_y = [V_{TC1} - V_{TC3}]/(2k \cos\theta) \quad (7)$$

$$a_z = [V_{TC1} + V_{TC3}]/(2k \sin\theta) \quad (8)$$

Equations (6) to (8) describe how accelerations in the x, y and z axes are related to the outputs of the four temperature sensors. Where θ=45° the sensitivities to accelerations along the y and z axes are the same, and are 0.707 times the sensitivity to accelerations along the x axis. For other values of θ, the sensitivities in the y and z axes will be different (assuming that the temperature sensors all have the same characteristics).

The sensitivity of the accelerometer to acceleration in each direction may have a component determined by geometry as well as a component determined by the particular characteristics of the temperature sensors and/or heaters used to monitor acceleration on the axis in question. In some embodiments, the accelerometer is provided with a circuit that produces output signals indicative of acceleration along at least each of two or three axes. In such embodiments, the circuit may apply at least the geometrical components of the sensitivities to the raw signals measured for the corresponding temperature sensors (for example by multiplication) so that the output signals all vary in the same way with acceleration along the corresponding axes. The circuit may comprise a data processor programmed to apply the sensitivities to the raw signals and to product the output signals, which may comprise analog or digital signals, or both. The circuit may also linearize the output signals, as is known in the art.

Figure 8F:
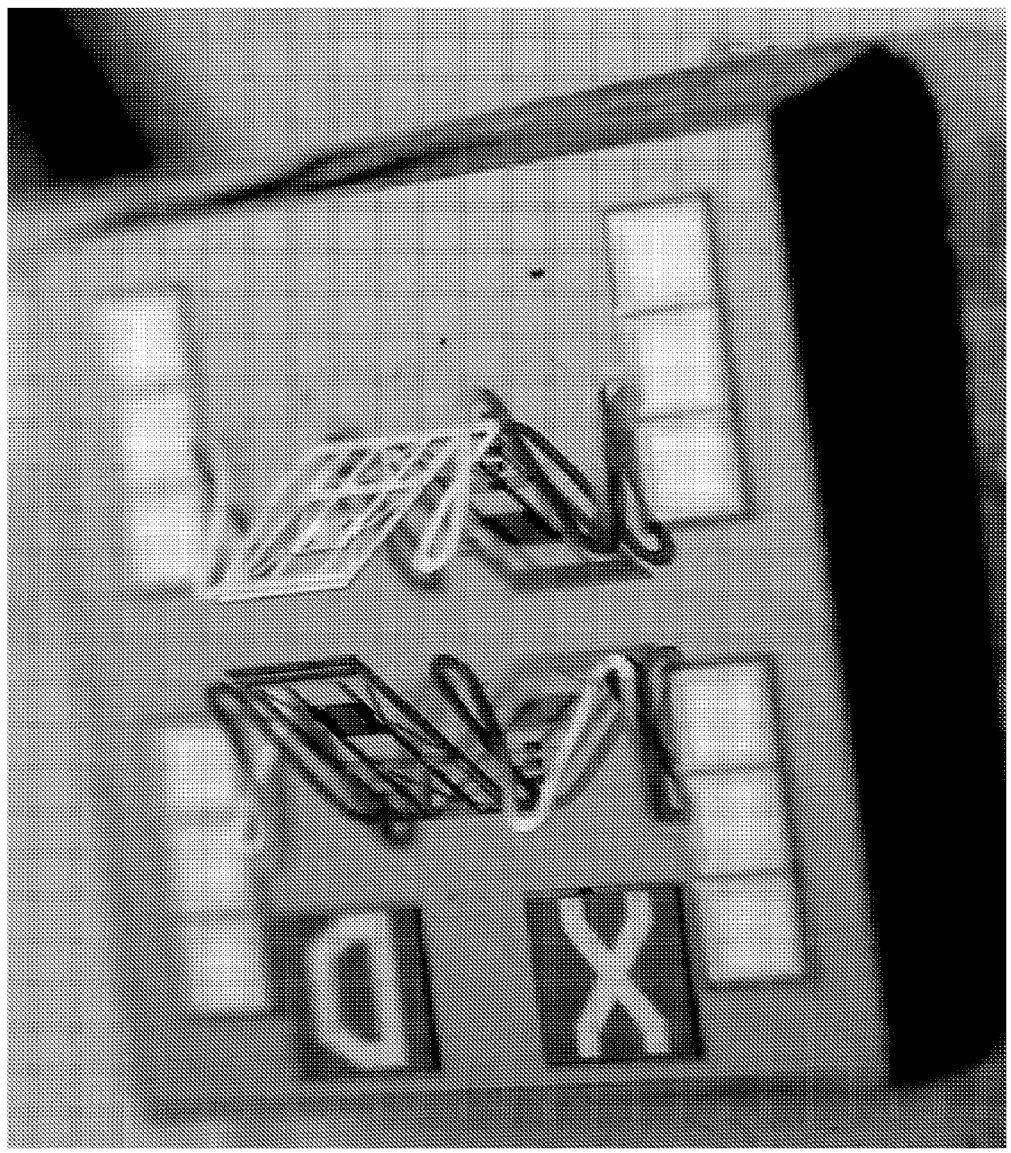
Figure 8G:
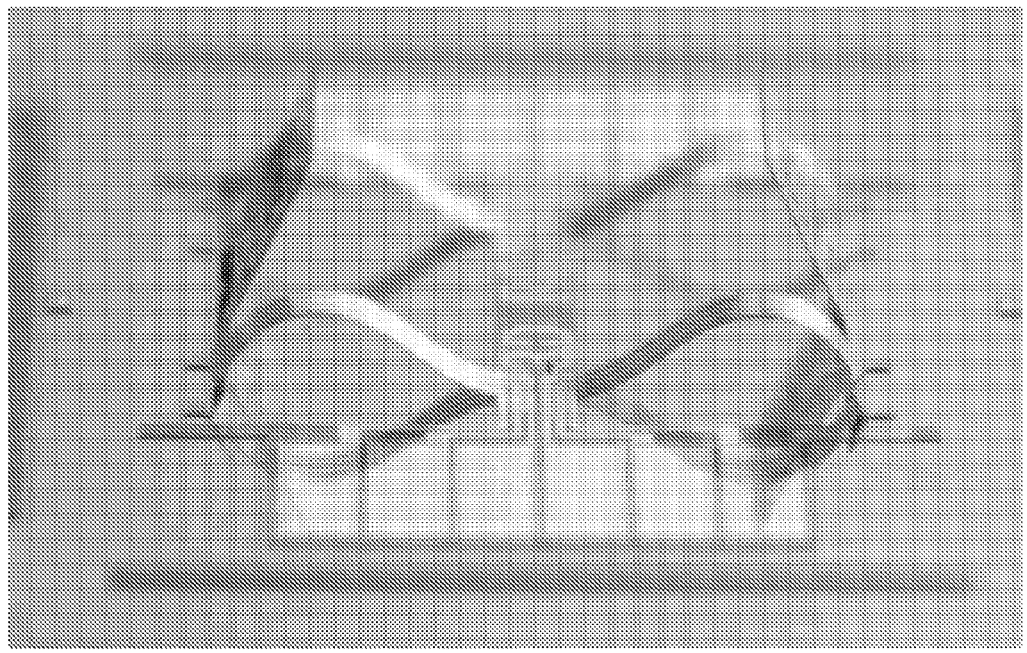

Sensor plates 232A and 232B may be supported in any suitable manners. For example, sensor plates 232A and 232B may be supported as shown in FIGS. 5A to 6E. FIG. 8F shows an accelerometer structure like that of FIG. 8E in which two sensor plates are each held at an angle to a substrate in the manner illustrated by FIGS. 6A to 6E. FIG. 8G shows an accelerometer structure like that of FIG. 8E in which two sensor plates are each held at an angle to a substrate in the manner illustrated by FIGS. 5B and 5E.

Microstructures having features as described in the various embodiments shown in the Figures may be made using a wide range of materials and patterning processes. For example, such microstructures may be formed of silicon, polysilicon, metals, or other materials that can be applied to a substrate. The material(s) of the microstructure may be the same as or similar to the material of the substrate or may differ from the material of the substrate.

In some embodiments such microstructures are fabricated using technology that is useful for micromachining silicon or other suitable crystalline or polycrystalline materials.

In some embodiments such microstructures are fabricated using technology like that used to fabricate flexible circuits. Polyimide is an example of a dielectric material used to manufacture flexible circuits.

Figure 9:
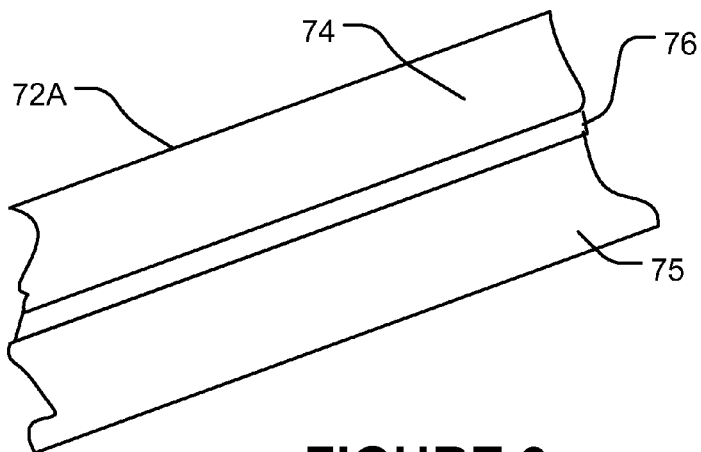
FIG. 9 is a detailed cross section of a cantilever member having electrical conductors sandwiched between top and bottom parts of the cantilever member. The electrical conductors are on a neutral plane within the member.
Figure 9A:
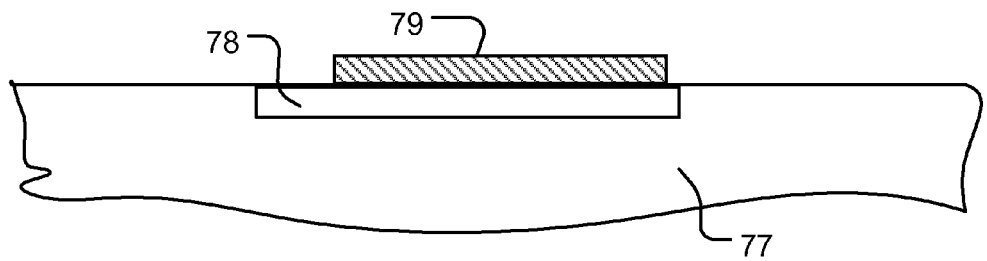
FIG. 9A shows a substrate, an electrical circuit formed on the substrate, and a patterned layer covering a portion of circuit.

Current processes of the type used for making flexible circuits permit deposition of polyimide layers with thicknesses as small as about 7.5 μm or less. Metal lines as fine as 25 μm can be patterned on such flexible circuits. This resolution is limited in some current processes by the thickness of the metal layers (often 25 μm to 30 μm) and the resolution of the photomasks used in such processes (for example up to 14 μm or so in some processes). In some embodiments of this invention, microstructures are prepared using the same methods used to make flexible circuits. In some embodiments, such techniques are modified by using thinner metal layers (for example, metal layers of about 6 μm or less in thickness) and high quality photomasks. By using high resolution photomasks and thin metal layers it is possible to pattern metal lines having widths as small as several microns. With this approach, microstructures as described herein may be formed on substrates such as printed circuit boards at very low cost. FIG. 9A illustrates a substrate 77, an electrical circuit 78 formed on substrate 77, and a patterned layer 79 covering a portion of circuit 78.

Advantages of some embodiments include:
  They permit 3-dimensional devices to be made in-plane using a process which provides a single structural layer. This is in contrast to structures requiring hinges fabricated from multiple structural layers.
  The structures may be made with standard processes as are used to make other MEMS devices. Specialized processing is not required during fabrication.
  In embodiments having no hinges, electrical connections may be made by extending electrical conductors along parts of the microstructure that are anchored to the substrate (such as springs 124 or cantilevers 102).
  The microstructures may be made using materials that can be deposited and patterned using low process temperatures. For example, some processes can be used to deposit polyimides at temperatures of 200° C. to 350° C. or less. Such processes may be applied to deposit the polyimides in patterns which provide microstructures as described herein.

Another aspect of the invention relates to the construction of micromechanical members that carry electrical conductors and are intended to be buckled in use. According to this aspect of the invention, electrical conductors are provided between top and bottom parts of a structure that is intended to flex or buckle in use. The structure may comprise a cantilever member or spring such as are described above, for example. The electrical conductors may, for example, comprise thin electrically-conducting films. The electrically-conducting films may comprise suitable metals or semiconductors, for example.

The thickness and materials of the top and bottom parts of the structure are selected so that the electrical conductors lie on an axis of the structure such that the electrical conductors will not be subjected to significant tensile stress when the structure is flexed or buckled. In some embodiments, the electrical conductors are provided substantially on a neutral axis of the structure. In theory, material on the neutral axis will experience no stress as the structure flexes. Such a structure may be used as a cantilever in a structure having a buckled cantilever, as described herein and may also be applied in other contexts.

In some embodiments, the top and bottom parts of the structure comprise layers of an electrically non-conducting material that are equal in thickness. For example, the top and bottom parts of the structure may comprise layers of polyimide that are equal in thickness. FIG. 9 shows schematically an example of such a structure.

In some embodiments, electronic sensors or other components such as heaters, temperature sensors, and the like are disposed between the top and bottom parts of the structure.

Structures as described above may be erected by moving a component of the structure in a direction that is generally parallel to the surface of a substrate. Methods for erecting microstructures may involve using an automated device to push components that are lying parallel to a surface of a substrate and are anchored to the substrate by deformable elements to cause the components to lift out of the plane of the substrate into a stable erected configuration. In some embodiments the pushing is performed by pushing with a wire-bonding tip that is moved relative to the substrate by an automated wire-bonding machine. In some embodiments, the push used to erect a microstructure may occur in a direction other than generally parallel to the substrate.

Wire bonding machines are typically used to attach small wires to bonding pads at selected locations on microchips. The wires are typically of gold, aluminum or copper and are welded onto bond pads of a microchip (typically a silicon microchip) and its package either by thermo-compression bonding or thermo-sonic bonding.

A wide range of wire bonding machines is commercially-available. A wire-bonding machine has a tip. In most wire bonding machines, the position of the tip is fixed in space and the microchip is translated and/or rotated to bring the tip into position over a feature of the microchip or its package. The X, Y location over which the tip is located can be controlled by suitable actuators. The actuators typically move the chip (or a stage on which the chip is mounted). Any suitable mechanism may be provided to move the tip relative to the microchip. Operating the actuators moves the tip and microchip relative to one another. The actuators can be operated to move the microchip and/or tip so that the tip is positioned over a selected X, Y location in a plane of the microchip.

The tip can be advanced toward the microchip (i.e. advanced in the −Z direction) to bring a wire into contact with a bonding pad and then a welding process can be performed to affix the wire to the bonding pad. Some wire bonding machines have sensing systems (such as imaging systems) and pattern recognition systems that recognize bonding pads and other features of the microchip and sequentially position the tip over locations at which wires are to be attached to the chip and the locations of corresponding pins of a package for the chip under the tip. Modern wire bonding machines are highly automated and are capable of automatically attaching wires to a large number of locations on a microchip.

A wire bonding machine, probe station or other suitable automated device capable of moving a tip in a controlled manner relative to a substrate can be used to erect microstructures on the substrate. A method for making a 3-D microstructure may involve providing a microstructure that can be erected by moving an actuating element of the microstructure, positioning the tip of a wire bonding machine adjacent to the actuating element, and then advancing the tip of the wire bonding machine to move the actuating element (and therefore the erect the microstructure). An automated wire bonding machine or other suitable automated device may be programmed to move a probe tip in a sequence of moves that results in the erection of multiple microstructures on one substrate.

In some embodiments the probe tip moves an actuating element substantially in the plane of the microchip to erect the microstructure. In such embodiments, the tip may be brought into contact with the substrate and then moved along the substrate or lifted by a small amount and moved parallel to the substrate to erect the microstructure. Microstructures of the types described above may be erected by pushing on an appropriate part of the microstructure with a probe tip.

Figure 10:
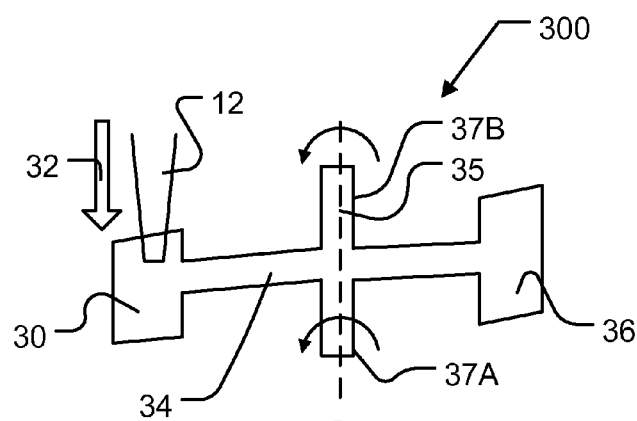
FIG. 10 shows a microstructure comprising a pad which permits the microstructure to be moved into an erected configuration by pressing down on the pad.

In other embodiments the probe tip depresses an actuating element to erect the microstructure. For example, FIG. 10 shows a microstructure 300 comprising a pad 30. Tip 12 is positioned over pad 30 and moved toward pad 30 as indicated by arrow 32. Continued motion of tip 12 depresses pad 30. Pad 30 is connected to a member 36 by a beam 34 which is configured to pivot around an axis 35. In the illustrated embodiment, beam 34 is mounted on torsion members 37A and 37B which are, in turn, mounted to suitable anchors (not shown). The microstructure 300 is an example of a microstructure that can be moved from an initial in-plane configuration to an erected configuration in which at least part of the microstructure projects out of the plane of a substrate by pushing an actuating element (e.g. pad 30) toward the substrate. In some embodiments a linkage is moved by the motion of member 36 away from substrate 18 and the linkage moves some other element to an erected configuration.

Utilizing the precise alignment and position/force capabilities of an automatic wire bonding machine to elevate a 3-D microstructure can offer advantages such as:

- only standard equipment (automatic wire bonder) compatible with volume production is required;
- non-standard processes or specialized equipment are not required;
- the actuation force that a typical wire bonding machine can apply is more than adequate for the erection of many 3-D structures.
- state-of-the art wire bonding equipment can maintain high throughput while keeping costs relatively low.
- The same equipment may be used to erect microstructures on a chip and to bond wires to the chip.

Erection of a 3-D microstructure can be carried out after an individual device has been placed in a package and is ready for wire bonding.

The wire bonding machine may comprise an imaging sensor, such as a camera, scanner, or other imaging sensor. Based upon images from the imaging sensor, the wire bonding machine may identify a location from which tip 12 can be moved to deploy a microstructure into an out-of-plane configuration and then automatically move the tip 12 of the wire bonding machine at the position. The wire bonding machine may then move tip 12 so as to deploy the microstructure. The wire bonding machine may be configured to automatically deploy a plurality of microstructures on the same substrate 18 by pressing tip 12 in an appropriate direction against a movable element of each microstructure.

The wire bonding machine may have a force control for applying forces consistently in the z direction (perpendicular to a substrate) during welding. Such a force control may be used to advantage. The force applied by tip 12 to the substrate in the z direction may be controlled to have a small value such that tip 12 can slide over the substrate when being moved parallel to the substrate to deploy a microstructure.

Where a wire bonding machine is used to deploy microstructures, as described herein, the wire bonding machine may be used to both attach wires to bonding pads on the substrate and erect microstructures in the same set up. This may be done after a device comprising a microstructure has been cut from a wafer, if necessary, and inserted into a package.

Figure 11:
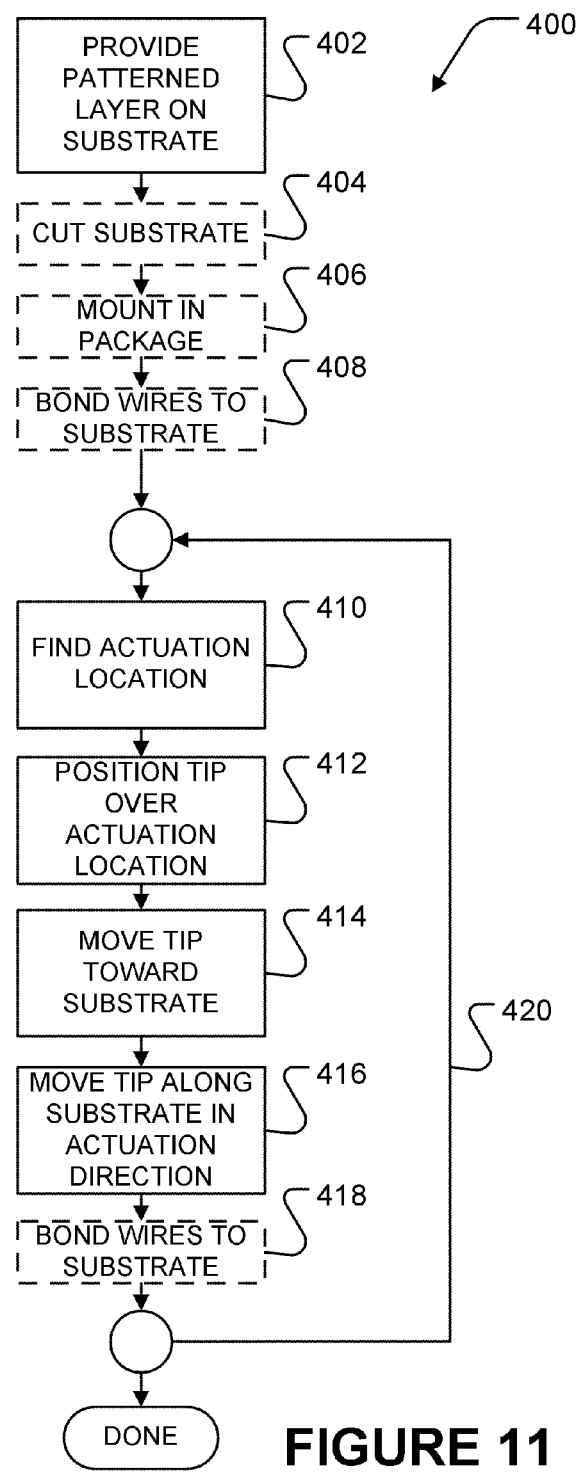

FIG. 11 is a flow chart illustrating an example method 400 for erecting microstructures using a wire-bonding machine or the like. In block 402 a patterned layer is provided on a substrate. The layer is patterned in a way that defines an erectable structure, as described herein. The erectable structure has at least one part anchored to the substrate and another part that can be erected out of the plane of the substrate. In some embodiments, block 402 involves applying the patterned layer over top of circuits, such as CMOS circuits that have been previously formed in the substrate. In some such embodiments, the patterned layer is applied by a low-temperature process to avoid damaging the circuits. In some such embodiments, electrical connections are established between the circuits and electrical conductors in parts of the patterned layer that are anchored to the substrate.

In block 404, the substrate is cut, if necessary. For example, where the substrate comprises a wafer on which multiple separate chips are patterned, the wafer may be cut to separate the chips. Advantageously, the cutting may be performed while the microstructures are not erect.

In block 406 the substrate is mounted in a package, if desired.

In block 408 the substrate is mounted in a wire-bonding machine. In block 408, the wire bonding machine may be operated to bond wires to various locations on the substrate and to various pins on any package in which the substrate is mounted. These actions are part of the normal operation of a wire-bonding machine.

In block 410, the wire-bonding machine finds a location for actuating the erection of a microstructure on the substrate. Block 410 may comprise applying an imaging and pattern-recognition system on the wire-bonding machine to identify features on the substrate.

In block 412 the wire-bonder tip is positioned over an actuation location. Block 412 may comprise operating actuators of the wire-bonding machine to move the substrate relative to the tip. Block 412 may use stored information which specifies where the actuation location is relative to features on the substrate that were identified in block 410.

In block 414 the wire-bonding tip is moved toward the substrate until it is touching the substrate or is close enough to the substrate to move a component of the erectable structure. Block 414 may involve the use of a tip force sensor, if the wire-bonding machine is so-equipped, to cause the tip to bear lightly against the substrate.

In block 416 the tip is moved along relative to the substrate in an actuation direction until the tip contacts and moves an actuating element associated with the microstructure. Motion of the actuating element causes the microstructure to be erected.

In block 418, if desired, more wires may be bonded to the substrate and/or its package. As indicated by loop 420, blocks 410 through 418 may be repeated as many times as desired to erect additional microstructures on the substrate and/or to bond wires to the substrate and/or its package.

Figure 12:
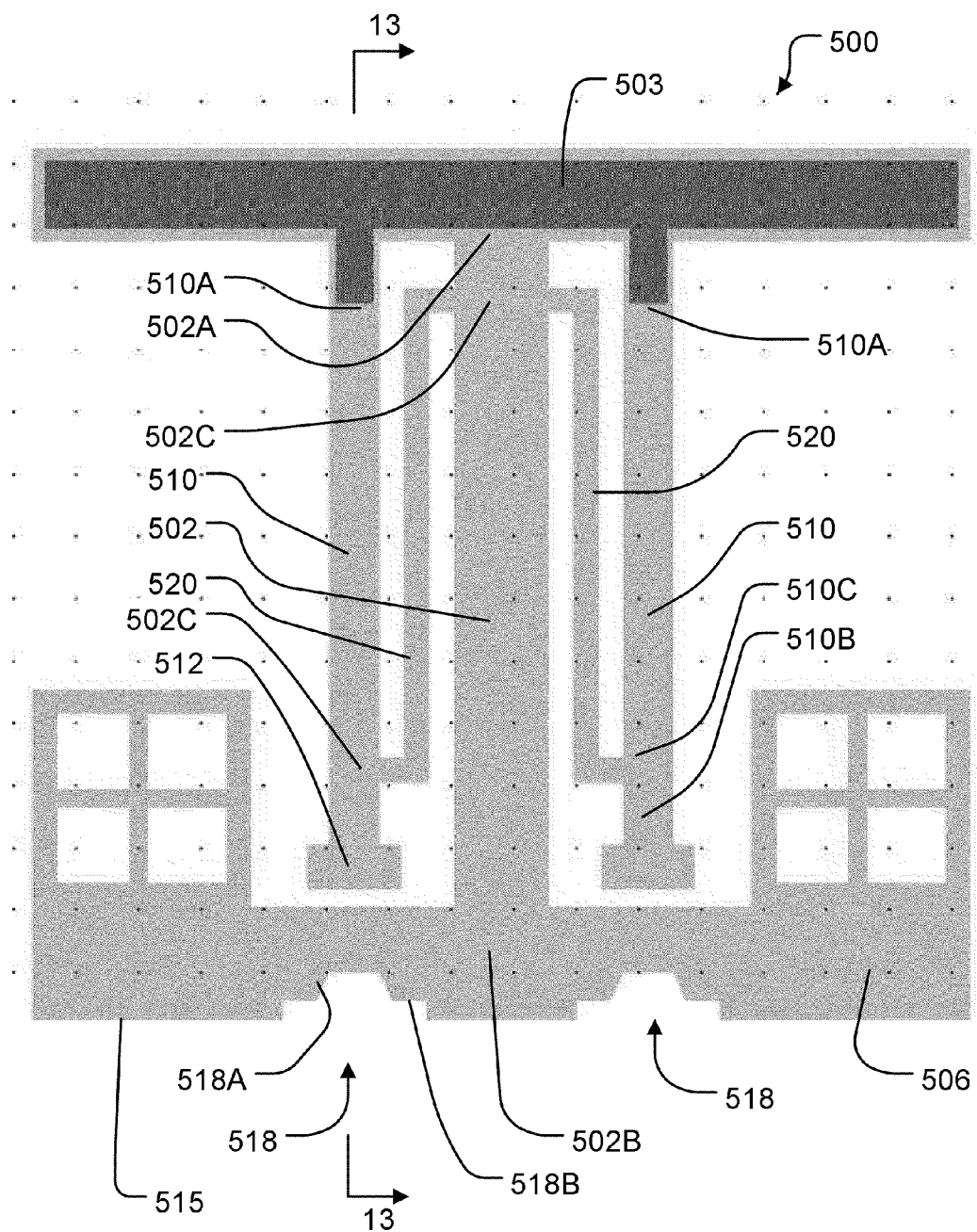
FIG. 12 is a plan view of an unassembled microstructure having a latching cantilever.

FIG. 12 shows a microstructure 500 that incorporates a latching mechanism for holding the microstructure in an erected configuration. A similar latching mechanism may be provided in other embodiments as described above. Microstructure 500 comprises a cantilever 502 having one end 502A anchored to substrate 504 by an anchor 503 and another end 502B that is free. In the illustrated embodiment, a support structure, here having the form of a plate 506, is supported on free end 502B. Plate 506 may support sensors, electronic components, optical components or other elements (not shown in FIG. 12) that are desired to be supported away from the surface of substrate 504.

The latching mechanism comprises one or more latching cantilevers 510. In the illustrated embodiment, two latching cantilevers 510 are shown. Cantilever 510 has one end 510A anchored to substrate 504 and a free end 510B bearing an enlarged head 512. In the illustrated embodiment, anchored ends 510A of cantilevers 510 are aligned with anchored end 502A of cantilever 502 along a line that is perpendicular to the longitudinal axis of cantilever 502. This tends to be a convenient arrangement. Cantilevers 510 and 502 may be anchored to substrate 504 by a single extended anchor 503. In alternative embodiments, cantilevers 510 and 502 may be anchored to substrate 504 by separate structures and/or anchored ends 510A of cantilevers 510 may be displaced toward or away from free end 502B of cantilever 502 relative to anchored end 502A.

In the illustrated embodiment, head 512 is T-shaped (although this is not mandatory). It is generally desirable but not mandatory that head 512 be symmetrical about the axis of cantilever 510. A distal edge 515 of plate 506 is shaped to provide notches 518 that can receive cantilevers 510 but will not pass enlarged heads 512. In the illustrated embodiment, latching cantilevers 510 extend parallel to cantilever 502 and are aligned with notches 518.

When the microstructure is erected and the latching mechanism is in place, latching cantilevers 510 are engaged in notches 518. The latching mechanism is designed so that free ends 510B of latching cantilevers 510 are biased away from the surface of substrate 504 when the microstructure is in its erected configuration, thereby holding latching cantilevers 510 in place (See FIG. 13F).

In the illustrated embodiment, latching cantilevers 510 are connected to main cantilever 502 by tether members 520. Tether members 520 latching cantilever(s) 510 and main cantilever(s) 502 may be integral with one another although this is not mandatory. Tether members 520 latching cantilever(s) 510 and main cantilever(s) 502 may be fabricated from the same layer of material.

Tether members 520 are attached to main cantilever 502 at a location 502C between ends 502A and 502B. Location 502C is preferably between the midpoint of main cantilever 502 and anchored end 502A. Each tether member 520 is attached to the corresponding locking cantilever 510 at a location 510C between ends 510A and 510B. Location 510C is preferably between the midpoint of the locking cantilever 510 and free end 510B.

Figure 13A:
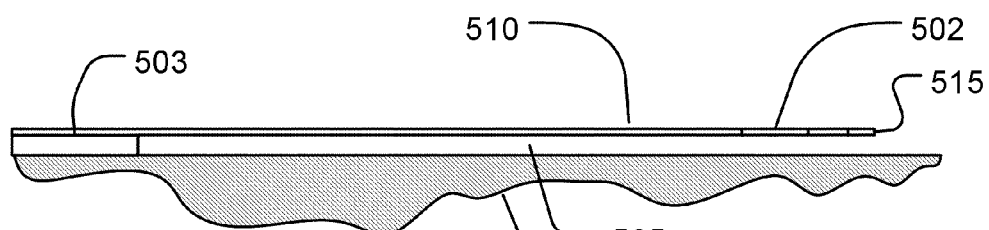
FIGS. 13A to 13F are schematic elevation views illustrating configurations of the microstructure of FIG. 12 at different stages in its erection.
Figure 13B:
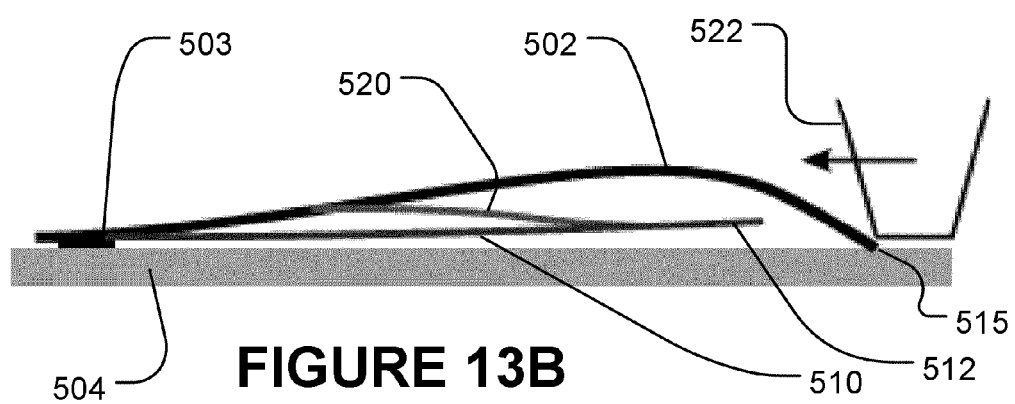
Figure 13C:
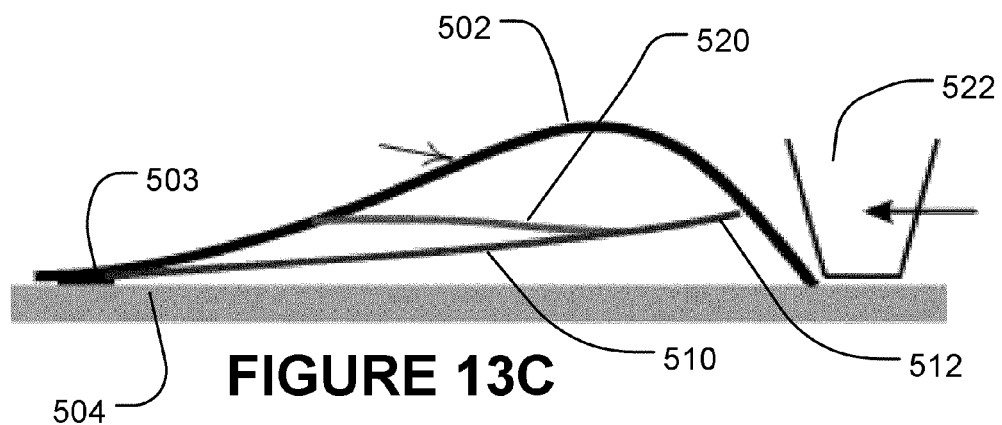
Figure 13D:
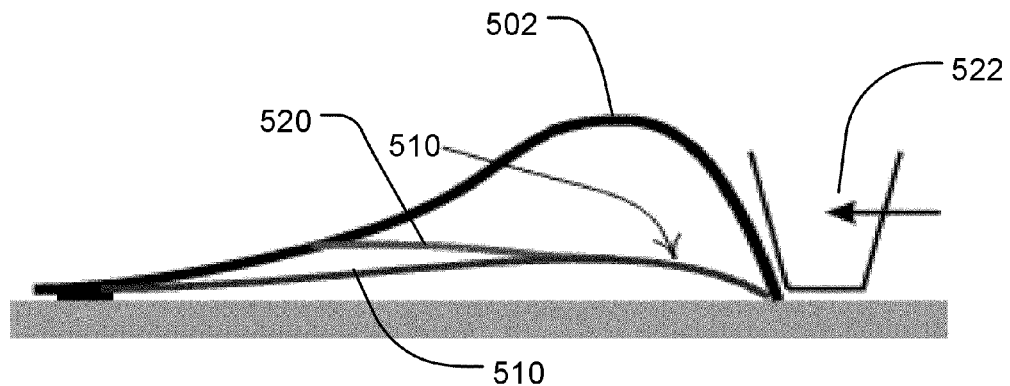
Figure 13E:
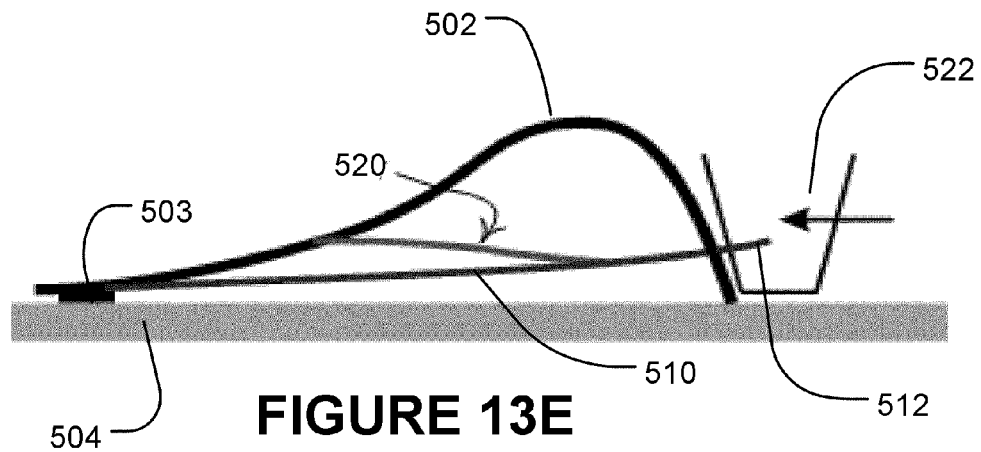
Figure 13F:
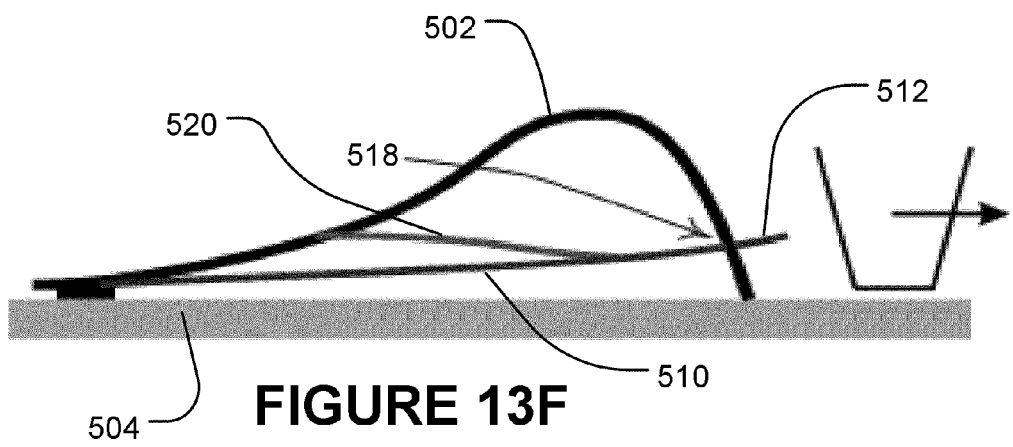

FIGS. 13A to 13F illustrate the erection of microstructure 500 by a probe 522. Probe 522 may comprise a tip moved by a micromanipulator, a wire bonding machine or the like. FIG. 13A shows microstructure 500 prior to erection. Cantilever 502 and locking cantilevers 510 are spaced apart from the surface of substrate 504 by a gap 505 except where they are anchored to substrate 504.

In FIG. 13B, tip 522 has started to push against edge 515 so that cantilever 502 has started to buckle away from the surface of substrate 504. This buckling has moved location 502C away from the surface of substrate 504 and also toward anchor 503. The movement of location 502C applies tension to tether members 520. In FIG. 13B, tether members 520 have started to pull free ends 510B of latching cantilevers 510 away from the surface of substrate 504. Continued motion of tip 522 toward anchor 503 causes cantilever 502 to become more buckled and consequently causes tether members 520 to pull free ends 510B of latching cantilevers 510 farther away from substrate 504. At the same time, the buckling of cantilever 502 causes the free end of cantilever 502 and plate 506 to become angled more and more steeply to the surface of substrate 504.

As shown in FIG. 13D, continued motion of edge 515 toward anchor 503 eventually results in heads 512 of latching cantilevers 510 contacting the under face of plate 506 and riding down the angled under face of plate 506 toward edge 515. The free ends 510B of latching cantilevers 510 are elastically bent toward substrate 504.

Figure 15:
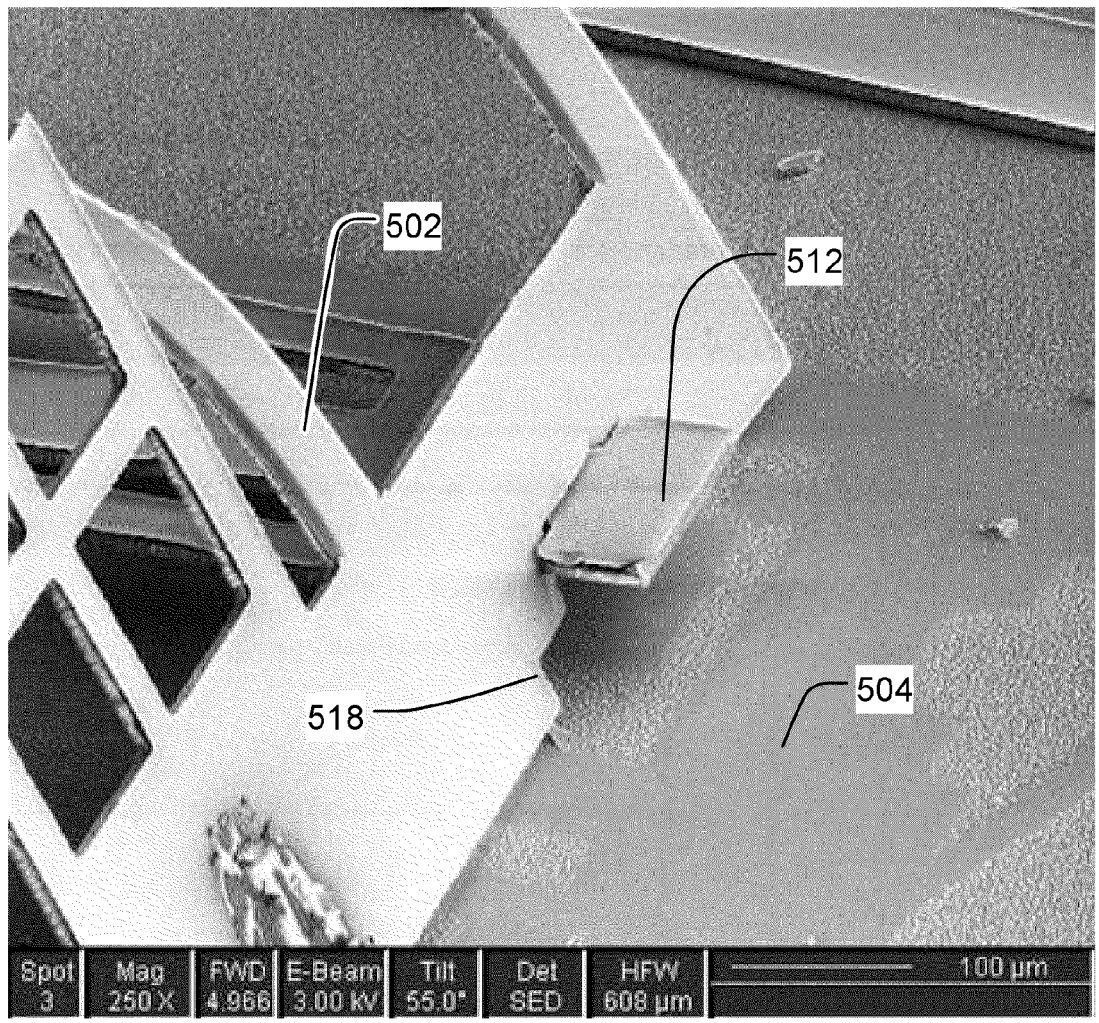

Still further motion of edge 515 toward anchor 503 results in edge 515 riding over heads 512. As soon as heads 512 have passed edge 515, latching cantilevers 510 move into notches 518 as shown in FIGS. 13E and 15. As shown best in FIG. 12, in the illustrated embodiment, inner portions 518A of notches 518 are tapered to facilitate guiding cantilevers 510 into engagement in notches 518. Also, the outermost parts 518B of notches 518 are wide enough to allow heads 512 to pass through while edge 515 remains in contact with the surface of substrate 504.

Figure 14:
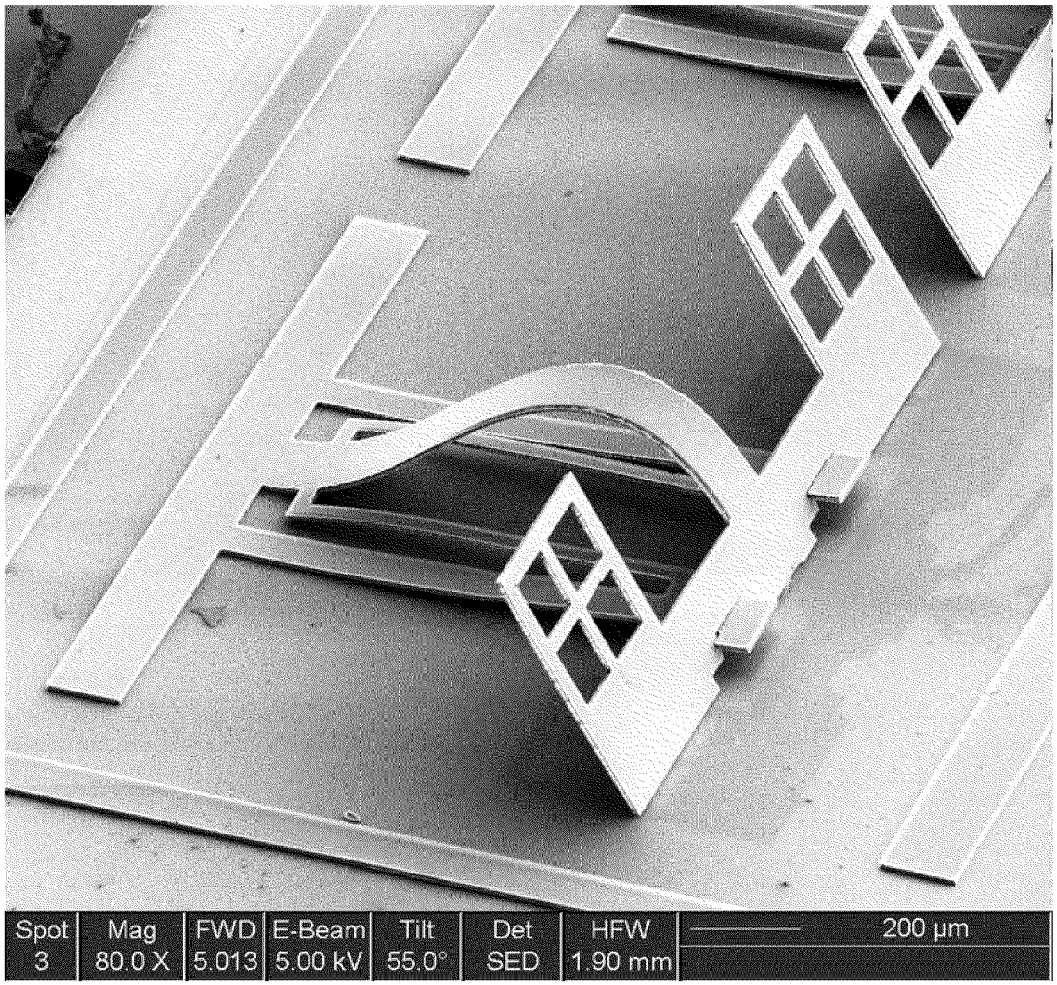
FIGS. 14 and 15 are microphotographs showing a prototype microstructure having the general arrangement illustrated in FIG. 12.

Once latching cantilevers 510 are engaged in notches 518, the force exerted on latching cantilevers 510 by tether members 520 tends to keep latching cantilevers 510 engaged in notches 518. Where plate 506 is not yet perpendicular to substrate 504 when microstructure 500 is erected then the force exerted by cantilever 502 which tends to push plate 506 away from anchor 503 coupled with the angle of plate 506 tends to pull latching cantilevers 510 into firmer engagement in notches 518 as illustrated in FIG. 14.

It is good design practice to make microstructures as described herein, including microstructure 500 symmetrical. In microstructure 500 it is desirable that force components in the plane of substrate 504 be directed along cantilevers 502 and 510. For example, microstructure 500 is bilaterally symmetrical about the centerline of cantilever 502 as can be seen in FIG. 12.

A latching mechanism like that provided in microstructure 500 may be particularly advantageous in cases where the microstructure may be subjected to extreme shock or vibration.

Many variations in microstructure 500 are possible. By way of example only,

A latching mechanism such as that provided in microstructure 500 may be provided in other microstructures including those other microstructures as described above.

Heads 512 may be L-shaped or have other shapes which prevent heads 512 from pulling through notches 518 (although symmetrical heads such as T-shaped heads are generally preferred because they are symmetrical).

Heads on latching cantilevers may engage at a side edge of plate 506 instead of engaging notches in edge 515.

In some embodiments cantilever 502 does not have an enlarged part such as a plate 506 at its free end 502.

A microstructure having a latching mechanism like microstructure 500 may comprise two or more main cantilevers 502 as shown, for example, in FIG. 5B.

Plate 506 may be caused to be oriented so that it is skewed (i.e. in plan view not perpendicular to the centerline of cantilever 502) when in its erected configuration by making latching cantilevers 510 have slightly different lengths and/or by offsetting the anchored ends of cantilevers 510 slightly relative to one another.

In any of the embodiments described herein, the substrate may comprise circuits such as integrated circuits. The circuits may comprise CMOS circuits, for example. This is because there are processes available for making microstructures as described herein that are compatible with a range of integrated circuit types. The integrated circuits may include conductors that connect with electrical conductors of the microstructures. In some embodiments, the microstructures are formed on top of a CMOS or other integrated circuit after the circuits on the integrated circuit have been made using suitable CMOS or other fabrication techniques.

Where a component (e.g. a substrate, anchor, chip, assembly, device, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

As will be apparent to those skilled in the art in the light of the foregoing disclosure, many alterations and modifications are possible in the practice of this invention without departing from the spirit or scope thereof.

What is claimed is:

1. Apparatus comprising:
   a substrate;
   a member extending substantially parallel to a surface of the substrate, the member connected to the substrate by at least one resiliently flexible element, the resiliently flexible element having a first end anchored to the substrate and a second end attached to the member;
   wherein:
   the member is movable along the surface of the substrate in at least a first direction,
   the resiliently flexible element has a stiffness in respect of bending about a first bending axis that is transverse to the first direction that is less than a stiffness of the flexible element in respect of bending about a second bending axis that is at right angles to the substrate,
   wherein the flexible element is deformable to project away from the substrate in response to motion of the member in the first direction and, upon moving the member in the first direction, a first edge of the member or the flexible element is engageable with the surface of the substrate, such that engagement of the first edge with the substrate resists motion of the first edge along the substrate such that the member is held in a configuration such that the member projects away from the surface of the substrate.

2. Apparatus according to claim 1 wherein the flexible element comprises a cantilever and the second end of the cantilever is anchored to the member at a location that is on a side of the member opposed to the first edge.

3. Apparatus according to claim 2 wherein the cantilever is unitary with the member.

4. Apparatus according to claim 2 wherein the cantilever has a width in a direction parallel to the substrate that is greater than a thickness of the cantilever.

5. Apparatus according to claim 2 wherein the cantilever constitutes one of two cantilever elements and the member extends between the two cantilever elements.

6. Apparatus according to claim 2 comprising a projection projecting from the substrate wherein the first edge of the member is engageable with the projection.

7. Apparatus according to claim 2 comprising a recess in the substrate wherein the first edge of the member is engageable with the surface of the substrate by engaging the first edge of the member in the recess.

8. Apparatus according to claim 1 wherein the at least one flexible element comprises first and second sinuous springs, the first sinuous spring connected between a first point on the member and a first anchor point on the substrate, the second sinuous spring connected between a second point on the member and a second anchor point on the substrate, the first edge spaced apart from a line joining the first and second points by a distance, D.

9. Apparatus according to claim 8 wherein the first and second springs are integral with the member.

10. Apparatus according to claim 8 wherein the first and second springs each comprise two bights on their sides facing away from the first edge.

11. Apparatus according to claim 10 wherein the first and second springs are mirror images of one another.

12. Apparatus according to claim 8 wherein the first and second springs are thinner than they are wide and have a ratio of thickness to width of 1 to 2 or more.

13. Apparatus according to claim 8 wherein a ratio of the stiffness of the springs in respect of bending about the first bending axis to the stiffness of the springs in respect of bending about the second bending axis is 1 to 7 or more.

14. Apparatus according to claim 11 wherein each of the springs has three hairpin bends.

15. Apparatus according to claim 8 wherein the first and second points on the member and the first and second anchor points are substantially collinear.

16. Apparatus according to claim 8 wherein a coefficient of friction between the first edge and the substrate exceeds 0.3.

17. Apparatus according to claim 8 wherein the first edge is frictionally engageable with the substrate and, when the member is substantially at right angles to the substrate a force applied by the springs to urge the first edge against the substrate is at least a factor of 1000 greater than a force of gravity acting on the member.

18. Apparatus according to claim 1 comprising an electrical conductor extending along the flexible element between the member and the substrate.

19. Apparatus according to claim 18 wherein the flexible element comprises first and second layers of electrically-insulating material on either side of the electrical conductor and the electrical conductor extends in a neutral plane of the flexible element in respect of bending about the first bending axis.

20. Apparatus according to claim 1 comprising:
an electrical circuit formed on the substrate;
wherein the member is part of a patterned layer on a surface of the substrate, the patterned layer covering at least a portion of the circuit.

21. Apparatus according to claim 20 wherein the patterned layer comprises one or more electrical conductors that are electrically connected to the circuit at one or more anchors anchoring the patterned layer to the substrate.

22. Apparatus according to claim 21 wherein the patterned layer comprises one or more sensors and the one or more sensors are interconnected to the circuit by the one or more electrical conductors.

23. Apparatus according to claim 22 wherein the one or more sensors comprise one or more temperature sensors.

24. Apparatus comprising:
a substrate;
a member extending substantially parallel to a surface of the substrate, the member connected to the substrate by at least one resiliently flexible element, the resiliently flexible element having a first end anchored to the substrate and a second end attached to the member;
wherein:
the member is movable along the surface of the substrate in at least a first direction,
the resiliently flexible element has a stiffness in respect of bending about a first bending axis that is transverse to the first direction that is less than a stiffness of the flexible element in respect of bending about a second bending axis that is at right angles to the substrate,
wherein:
the flexible element is deformable to project away from the substrate in response to motion of the member in the first direction and, upon moving the member in the first direction, a first edge of the member or the flexible element is engageable with the surface of the substrate to support the member in a configuration such that the member projects away from the surface of the substrate; and
the flexible element comprises a cantilever and the second end of the cantilever is anchored to the member at a location that is on a side of the member opposed to the first edge; and
the cantilever constitutes one of two cantilever elements and the member extends between the two cantilever elements;
the apparatus further comprising a projection projecting from the substrate, the projection located between the cantilever elements wherein the first edge is engageable with the projection and the cantilever elements are buckled when the first edge is engaged with the projection.

25. Apparatus comprising:
a substrate;
a member extending substantially parallel to a surface of the substrate, the member connected to the substrate by at least one resiliently flexible element, the resiliently flexible element having a first end anchored to the substrate and a second end attached to the member;
wherein:
the member is movable along the surface of the substrate in at least a first direction,
the resiliently flexible element has a stiffness in respect of bending about a first bending axis that is transverse to the first direction that is less than a stiffness of the flexible element in respect of bending about a second bending axis that is at right angles to the substrate,
wherein:
the flexible element is deformable to project away from the substrate in response to motion of the member in the first direction and, upon moving the member in the first direction, a first edge of the member or the flexible element is engageable with the surface of the substrate to support the member in a configuration such that the member projects away from the surface of the substrate; and
the flexible element comprises a cantilever and the member is connected to the cantilever by an isthmus portion, the isthmus portion having a width in a direction along the cantilever that is less than a width of the member in the direction along the cantilever.

26. Apparatus according to claim 25 wherein the substrate comprises an integrated circuit and the member overlies at least one component of the integrated circuit.

27. An out-of-plane microstructure comprising:
a substrate;
a resiliently flexible cantilever structure having a first end anchored to the substrate and a second free end, the cantilever structure extending over a surface of the substrate;
a stop member on the substrate;
wherein:
an edge of the cantilever structure is movable relative to the substrate in at least a first direction and is engageable with the stop member by moving the edge so that it passes over the stop member;
the cantilever structure is buckled and extends away from the substrate when engaged with the stop member in an erected configuration; and
the cantilever structure when engaged with the stop member exerts a force on the stop member in a direction away from the first end.

28. A microstructure according to claim 27 wherein the cantilever structure comprises first and second cantilever arms each having one end anchored to the substrate, the first and second cantilever arms joined by a member extending between the first and second cantilever arms.

29. A microstructure according to claim 28 wherein the edge is on the member extending between the first and second cantilever arms.

30. A microstructure according to claim 28 wherein the member extending between the first and second cantilever arms is at the free end of the cantilever structure.

31. A microstructure according to claim 28 wherein the stop member is located between the cantilever arms.

32. A microstructure according to claim 28 wherein the member extending between the first and second cantilever arms is one of a plurality of bridging members extending between the first and second cantilever arms.

33. A microstructure according to claim 27 wherein the cantilever structure comprises a cantilever arm having an element projecting laterally from either side of the cantilever arm, wherein the stop member comprises stop elements located on either side of the cantilever arm.

34. A microstructure according to claim 27 comprising an electrical conductor extending along the cantilever structure, the electrical conductor making an electrical connection to an electrical connector in or on the substrate.

35. A microstructure according to claim 34 wherein the cantilever structure comprises first and second layers of electrically-insulating material on either side of the electrical conductor and the electrical conductor extends in a neutral plane of the flexible element in respect of bending about a bending axis extending transversely of the cantilever structure.

36. An out-of-plane microstructure comprising:
a substrate;
a resiliently flexible cantilever structure having a first end anchored to the substrate and a second free end, the cantilever structure extending over a surface of the substrate;
a stop member on the substrate;
wherein:
an edge of the cantilever structure is movable relative to the substrate in at least a first direction and is engageable with the stop member by moving the edge so that it passes over the stop member;
the cantilever structure is buckled and extends away from the substrate when engaged with the stop member in an erected configuration; and
the cantilever structure comprises a cantilever arm extending from an anchor and a member connected to the cantilever arm by an isthmus, the isthmus having a width in a direction along the cantilever arm that is less than a width of the member in the direction along the cantilever arm.

37. A microstructure according to claim 36 wherein the member extends at an angle to the substrate in excess of 70 degrees when the microstructure is in the erected configuration.

38. An out-of-plane microstructure comprising:
a substrate;
a resiliently flexible cantilever structure having a first end anchored to the substrate and a second free end, the cantilever structure extending over a surface of the substrate;
a stop member on the substrate;
wherein:
an edge of the cantilever structure is movable relative to the substrate in at least a first direction and is engageable with the stop member by moving the edge so that it passes over the stop member;
the cantilever structure is buckled and extends away from the substrate when engaged with the stop member in an erected configuration; and
the stop member comprises a locking cantilever having one end anchored to the substrate and another free end having an enlarged head.

39. A microstructure according to claim 38 comprising a tether member connecting the cantilever structure and the locking cantilever, the tether member affixed to the cantilever structure at a first location and affixed to the locking cantilever at a second location, the first location spaced apart from the second location in a direction along a longitudinal axis of the cantilever structure.

40. A microstructure according to claim 39 wherein the first location is between a midpoint of the cantilever structure and the first end of the cantilever structure.

41. A microstructure according to claim 40 wherein the second location is between a midpoint of the locking cantilever and the free end of the locking cantilever.

42. A microstructure according to claim 41 wherein the edge of the cantilever structure comprises a notch and the locking cantilever is engageable in the notch.

43. A microstructure according to claim 42 wherein the locking cantilever is a first one of two locking cantilevers, the two locking cantilevers extending parallel to the longitudinal axis of the cantilever structure, one of the two locking cantilevers on either side of the cantilever structure.

44. An accelerometer comprising:
a substrate,
first and second substantially planar sensor plates disposed symmetrically on the substrate, each of the sensor plates oriented at an angle, to a surface of the substrate;
first and second heaters on the first and second sensor plates respectively;
first and second temperature sensors on the first and second sensor plates respectively, the first and second temperature sensors each measuring a temperature differential between locations on the corresponding sensor plate that are at different elevations from the surface of the substrate wherein each one of the sensor plates comprises:
a member connected to the substrate by at least one resiliently flexible element, the resiliently flexible element having a first end anchored to the substrate and a second end attached to the member;
wherein:
the member is configured to be movable along the surface of the substrate in at least a first direction from a configuration in which the member extends substantially parallel to a surface of the substrate,
the resiliently flexible element has a stiffness in respect of bending about a first bending axis that is transverse to the first direction that is less than a stiffness of the flexible element in respect of bending about a second bending axis that is at right angles to the substrate,
the flexible element is deformable to project away from the substrate in response to motion of the member in the first direction and, by moving the member in the first direction, a first edge of the member or the flexible element is engageable with the surface of the substrate, such that engagement of the first edge with the substrate resists motion of the first edge along the substrate such that the member is held projecting away from the surface of the substrate at the angle.

45. An accelerometer according to claim 44 comprising at least a third temperature sensor on the first sensor plate, the third temperature sensor measuring a temperature differential between locations on the first sensor plate that are spaced apart along an axis that is substantially parallel to the surface of the substrate.

46. An accelerometer according to claim 44 wherein planes of the first and second sensor plates intersect the surface of the substrate along first and second lines that are substantially parallel to one another.

47. Apparatus comprising:
  a substrate;
  a patterned layer attached to the substrate at least one anchor point, the patterned layer comprising a resiliently-flexible cantilever projecting from the anchor point; and,
  a member connected to the cantilever by an isthmus portion having a width in a direction along the cantilever that is less than a width of the member in the direction along the cantilever
  wherein, upon buckling of the cantilever, the member is supported above the substrate by the cantilever at an angle tangent to a curvature of the buckled cantilever at a point of connection of the isthmus portion to the cantilever.

48. Apparatus according to claim 47 wherein the member is one of a plurality of members, each connected to the cantilever by a corresponding isthmus portion.

49. Apparatus according to claim 48 wherein each of the plurality of members is spaced along the cantilever by a different distance from the anchor.

50. Apparatus according to claim 47 wherein the width of the member is greater than a distance from the attachment point to the point of connection of the isthmus portion to the cantilever.

51. Apparatus according to claim 50 wherein the cantilever is a first one of first and second cantilevers and the member is connected by corresponding isthmus portions to each of the first and second cantilevers.

52. Apparatus according to claim 47 wherein the member is substantially planar.

53. Apparatus according to claim 47 comprising one or more electrical conductors extending from the substrate to the member by way of the cantilever.

* * * * *